(12) United States Patent
Seyama

(10) Patent No.: US 9,536,856 B2
(45) Date of Patent: Jan. 3, 2017

(54) FLIP CHIP BONDER AND FLIP CHIP BONDING METHOD

(71) Applicant: Shinkawa Ltd., Tokyo (JP)

(72) Inventor: Kohei Seyama, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 0 days.

(21) Appl. No.: 14/847,295

(22) Filed: Sep. 8, 2015

(65) Prior Publication Data

US 2015/0380381 A1 Dec. 31, 2015

Related U.S. Application Data

(63) Continuation of application No. PCT/JP2013/075478, filed on Sep. 20, 2013.

(30) Foreign Application Priority Data

Mar. 12, 2013 (JP) ................................ 2013-049541

(51) Int. Cl.
*B23K 37/00* (2006.01)
*H01L 23/00* (2006.01)
(Continued)

(52) U.S. Cl.
CPC ............. *H01L 24/75* (2013.01); *B23K 3/085* (2013.01); *B23K 37/04* (2013.01); *H01L 24/81* (2013.01); *H01L 2224/131* (2013.01); *H01L 2224/16225* (2013.01); *H01L 2224/16227* (2013.01); *H01L 2224/2919* (2013.01); *H01L 2224/32225* (2013.01); *H01L 2224/73104* (2013.01); *H01L 2224/73204* (2013.01);
(Continued)

(58) Field of Classification Search
None
See application file for complete search history.

(56) References Cited

U.S. PATENT DOCUMENTS 5,667,129 A * 9/1997 Morita ............... H05K 13/0413
228/102
5,839,645 A * 11/1998 Onitsuka ........... H01L 21/67132
228/180.22
(Continued)

FOREIGN PATENT DOCUMENTS

JP 05-291354 11/1993
JP 09-129677 5/1997
(Continued)

OTHER PUBLICATIONS

International Search Report dated Mar. 25, 2014, from related International Application No. PCT/JP2013/084042.
(Continued)

*Primary Examiner* — Kiley Stoner
(74) *Attorney, Agent, or Firm* — Katten Muchin Rosenman LLP

(57) ABSTRACT

Provided is a flip chip bonder including: a pickup flipping collet configured to flip a chip; and a bonding tool configured to receive the chip flipped with the pickup flipping collet from the pickup flipping collet and to bond the received chip to a circuit board. The pickup flipping collet includes a cooling channel through which cooling air flows to cool the pickup flipping collet. Thus, bonding time can be reduced without lowering bonding quality.

15 Claims, 20 Drawing Sheets

(51) Int. Cl.
*B23K 3/08* (2006.01)
*B23K 37/04* (2006.01)

(52) U.S. Cl.
CPC ........... *H01L 2224/7565* (2013.01); *H01L 2224/75501* (2013.01); *H01L 2224/75502* (2013.01); *H01L 2224/75621* (2013.01); *H01L 2224/75745* (2013.01); *H01L 2224/81191* (2013.01); *H01L 2224/81815* (2013.01); *H01L 2224/81948* (2013.01); *H01L 2224/83* (2013.01); *H01L 2224/83191* (2013.01); *H01L 2224/83862* (2013.01); *H01L 2224/9211* (2013.01); *H01L 2924/3701* (2013.01)

(56) References Cited

U.S. PATENT DOCUMENTS

| | | | | |
|---|---|---|---|---|
| 5,923,086 | A * | 7/1999 | Winer | H01L 23/467 257/707 |
| 8,196,798 | B2 * | 6/2012 | Luechinger | B23K 20/10 228/1.1 |
| 8,231,044 | B2 * | 7/2012 | Luechinger | B23K 20/10 228/4.5 |
| 2002/0187589 | A1 * | 12/2002 | Tsujimoto | H01L 21/67132 438/118 |
| 2004/0206800 | A1 * | 10/2004 | Arai | B23K 20/007 228/6.2 |
| 2004/0217100 | A1 * | 11/2004 | Ogimoto | B23K 20/023 219/243 |
| 2005/0098610 | A1 * | 5/2005 | Onobori | B23K 1/0016 228/180.21 |
| 2008/0040917 | A1 * | 2/2008 | Narita | H01L 21/67132 29/740 |
| 2010/0140326 | A1 * | 6/2010 | Ebihara | B23K 20/106 228/111.5 |
| 2010/0219229 | A1 * | 9/2010 | Fujita | H01L 24/75 228/110.1 |
| 2011/0142572 | A1 * | 6/2011 | Blonigan | C23C 16/45565 414/217 |
| 2014/0154037 | A1 * | 6/2014 | Sen | H01L 21/67144 414/744.2 |
| 2014/0175159 | A1 * | 6/2014 | Kostner | H01L 24/81 228/102 |
| 2015/0008254 | A1 * | 1/2015 | Wasserman | B23K 3/085 228/180.1 |
| 2015/0027616 | A1 * | 1/2015 | Chan | H01L 21/6838 156/64 |
| 2015/0036261 | A1 * | 2/2015 | Jindo | B32B 9/005 361/234 |
| 2015/0077895 | A1 * | 3/2015 | Jindo | F28F 21/086 361/234 |
| 2015/0129135 | A1 * | 5/2015 | Lee | H01L 24/75 156/378 |
| 2015/0155210 | A1 * | 6/2015 | Lee | H05K 13/046 438/15 |
| 2015/0171047 | A1 * | 6/2015 | Malatkar | H01L 24/75 156/583.1 |
| 2015/0173209 | A1 * | 6/2015 | Dhavaleswarapu | B23K 3/085 228/194 |
| 2015/0270438 | A1 * | 9/2015 | Sugihara | G02F 1/1303 438/27 |

FOREIGN PATENT DOCUMENTS

| | | | | |
|---|---|---|---|---|
| JP | 10-275833 | A | 10/1998 | |
| JP | 2000-019361 | A | 1/2000 | |
| JP | 2001-168146 | A | 6/2001 | |
| JP | 3399367 | B2 * | 4/2003 | ............ H01L 24/75 |
| JP | 2006-339464 | A | 12/2006 | |
| JP | 2010-114102 | A | 5/2010 | |
| JP | 2010-114103 | A | 5/2010 | |
| JP | 2012-174861 | A | 9/2012 | |

OTHER PUBLICATIONS

File History from related U.S Appl. No. 14/743,050.
International Search Report dated Dec. 17, 2013, from corresponding International Application No. PCT/JP2013/075478.
Written Opinion of the International Searching Authority dated Dec. 17, 2013, from corresponding International Application No. PCT/JP2013/075478.

* cited by examiner

FLIP CHIP BONDER AND FLIP CHIP BONDING METHOD

CROSS REFERENCE TO RELATED APPLICATIONS

This application is a Continuation of PCT International Application No. PCT/JP2013/075478 filed on Sep. 20, 2013, which claims priority under 35 U.S.C §119(a) to Patent Application No. 2013-049541 filed in Japan on Mar. 12, 2013, all of which are hereby expressly incorporated by reference into the present application.

TECHNICAL FIELD

The present invention relates to a structure of a flip chip bonder and a flip chip bonding method using a flip chip bonder.

BACKGROUND ART

Flip chip bonding in which bump electrodes also called bumps are formed on a chip and the chip is directly connected to a circuit board has become widely employed as a method of mounting a chip on a circuit board. The flip chip bonding is a method for joining a chip and a circuit board by forming a plurality of bumps (bump electrodes) made of a material such as solder on a circuit side of the chip, and heating and melting the bumps to join the bumps to a plurality of electrodes on a circuit board. As compared to a connecting method using the conventional wire bonding, the flip chip bonding has various advantages such as a reduced area for mounting, excellent electric characteristics, and elimination of necessity for mold sealing.

In the flip chip bonding, in order to ensure reliability of connection at a joining portion between a chip and a circuit board, it is required to perform resin molding of a gap between the chip and the circuit board using an underfill material or the like. However, using an underfill material has a problem that filling of a liquid resin requires times, as well as a problem that it has become difficult to inject a liquid resin under a present circumstance that a gap between a chip and a circuit board has become increasingly smaller. Therefore, there is proposed a bonding method in which resin molding between a chip and a circuit board is performed by applying a non-conductive film (NCF) previously to a surface of the chip, and performing melting and hardening of the resin at the same time as joining between the chip and the circuit board.

According to this method, the non-conductive film (NCF) is previously applied to the surface of the chip, and after the chip is suctioned to a holding member and picked up along with the non-conductive film (NCF), the chip is flipped by rotating the holding member, so that the side of the non-conductive film (NCF) faces downward. Then, a bonding tool is brought into contact with the side of the chip opposite of the side to which the non-conductive film (NCF) is applied and caused to suction the chip, and thus the chip is passed from the holding member to the bonding tool. Therefore, when the chip is transferred, the side of the chip to which the non-conductive film (NCF) is applied is in contact with an upper surface of the holding member, and the chip passed to the bonding tool has its side of the non-conductive film (NCF) face downward (the side of the circuit board). Thereafter, when the chip is pressed to the circuit board with the bonding tool, and the temperature of the bonding tool is increased up to the melting temperature of bumps (about 300° C.), the non-conductive film (NCF) melts at the same time as the bumps melt and comes between the chip and the circuit board. Then, after the bonding tool is moved upward, the temperature of the bumps and the non-conductive film (NCF) decreases and the metal of the molten bumps and the molten resin are hardened, and the bonding of the chip to the circuit board is completed.

Upon completion of the bonding, the bonding tool is heated as high as about 300° C. Therefore, if the bonding tool receives a chip coming next from the holding member at this temperature, the non-conductive film (NCF) applied to a chip surface (the side of the holding member) is heated and molten, and then adversely attached to a surface of the holding member when the bonding tool at high temperature is brought into contact with the chip. Accordingly, it is necessary to perform bonding after the bonding tool at high temperature is cooled down below the melting temperature of the non-conductive film (NCF) (e.g., about 50° C.), then the bonding tool receives a chip coming next from the holding member, and the temperature of the bonding tool is increased again. However, as the bonding tool is generally cooled using air at normal temperature (about 25° C. to 30° C.), it takes time to cool the bonding tool at the temperature as high as about 300° C. down to about 50° C. This results in a problem of increased bonding time as a whole.

Therefore, there is proposed a method for reducing bonding time by continuing bonding without cooling the bonding tool in a manner such that the chip is passed from the holding member to the bonding tool while being suctioned to the surface of the bonding tool in a state in which the holding member and the bonding tool are not in contact with each other, i.e., in a state in which transmission of heat to the holding member from the bonding tool is blocked.

SUMMARY OF INVENTION

Technical Problem

In the flip chip bonding, in order to join a large number of electrodes at the same time, it is necessary to correctly align relative positions of the chip and the circuit board. However, when the chip is suctioned to the bonding tool with a gap from the holding member as the conventional technique described in the background art, the chip has to be suctioned to the surface of the bonding tool after temporarily floating in the air. Therefore, there is a problem that the position and the direction of the chip are largely displaced and bonding quality is lowered.

Thus, an object of the present invention is to provide a flip chip bonder capable of reducing bonding time without lowering bonding quality.

Solution to Problem

A flip chip bonder according to the present invention includes: a flip mechanism configured to flip a chip; a bonding tool configured to receive the chip flipped by the flip mechanism from the flip mechanism and to bond the received chip to a substrate; and a cooling mechanism configured to cool the flip mechanism.

The flip chip bonder according to the present invention is preferably configured such that the flip mechanism includes a holding member for holding the flipped chip, and the cooling mechanism cools the holding member down to a predetermined temperature before the bonding tool receives the chip.

The flip chip bonder according to the present invention is preferably configured such that a heat capacity of the holding member is larger than a heat capacity of the bonding tool.

The flip chip bonder according to the present invention is preferably configured such that the holding member is a pickup flipping collet configured to pass the chip to the bonding tool in a state in which the chip is suctioned and flipped, or that the holding member is a transfer stage configured to transfer the chip in a state in which the chip is flipped, and to pass the chip to the bonding tool in the flipped state.

The flip chip bonder according to the present invention is preferably configured such that the cooling mechanism cools one of an inner surface and an outer surface of the holding member.

The flip chip bonder according to the present invention is preferably configured such that the cooling mechanism is provided with: a base body; and a cooling member including: a ground plate having a ground surface with which a surface of the holding member is brought into contact; and a radiating member attached to the ground plate, and the cooling member is supported on the base body by support mechanism that makes an orientation of the ground surface variable, so that the orientation of the ground surface aligns with an orientation of the surface of the holding member.

The flip chip bonder according to the present invention is preferably configured such that a heat capacity of the cooling member is larger than a heat capacity of the holding member, that the radiating member is attached to a surface of the ground plate on a side opposite of the ground surface, or that the radiating member is configured as radiator fins, a cooling fan configured to cool the radiator fins is provided.

The flip chip bonder according to the present invention is preferably configured such that the support mechanism supports the ground plate on the base body rotatably about two axes including: a first axis along the ground surface; and a second axis along the ground surface and perpendicular to the first axis, that there is provided a cooling nozzle provided for the base body, and configured to blow cooling air to the holding member having the surface in contact with the ground surface, or that heat transfer from the holding member to the ground plate occurs when the ground surface of the ground plate is brought into contact with the surface of the holding member.

A flip chip bonding method according to the present invention includes: a step of preparing a flip chip bonder including: a flip mechanism configured to flip a chip; a bonding tool configured to receive the chip flipped by the flip mechanism from the flip mechanism and to bond the received chip to a substrate; and a cooling mechanism configured to cool the flip mechanism; and a cooling step of cooling the holding member down to a predetermined temperature by the cooling mechanism before the bonding tool receives the chip.

Advantageous Effect of Invention

The present invention provides an effect of providing a flip chip bonder capable of reducing bonding time without lowering bonding quality.

DESCRIPTION OF EMBODIMENTS

Figure 1:
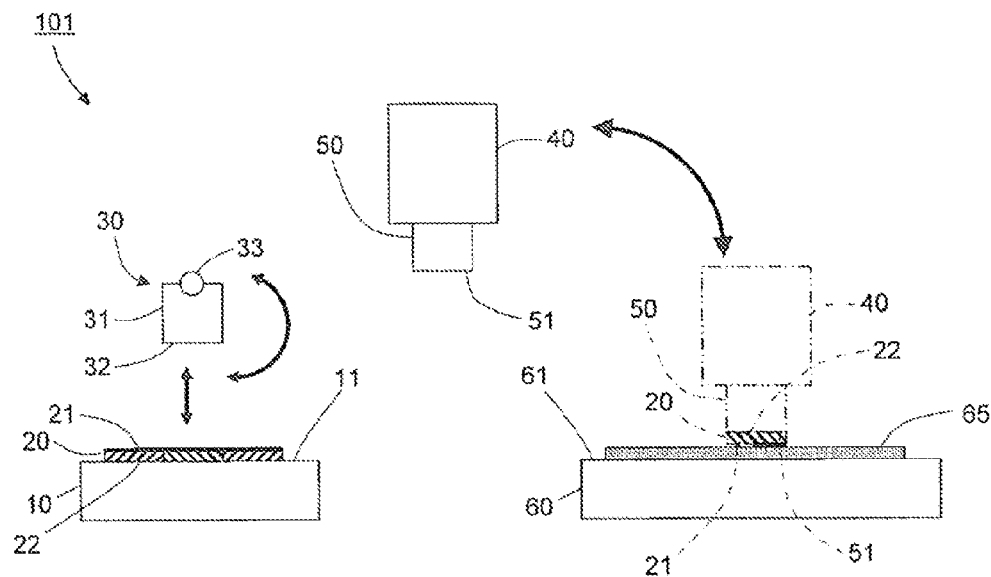
FIG. 1 is an elevational view illustrating a structure of a flip chip bonder of an embodiment according to the present invention.

Hereinafter, embodiments according to the present invention will be described with reference to the drawings. As illustrated in FIG. 1, a flip chip bonder 101 according to one embodiment picks a chip 20 having a surface 22 to which a non-conductive film (NCF) 21 is applied and flips the chip, and then mounts (bonds) the chip onto a circuit board 65 on a bonding stage 60. The flip chip bonder 101 according to this embodiment includes: a pick-up stage 10 configured to hold the chip 20 on an upper surface 11 thereof; a pickup flipping collet 30 as a flip mechanism configured to picks the chip 20 up from the upper surface 11 of the pick-up stage 10 by suctioning, and flips the picked chip 20; and a bonding tool 50 configured to receive the flipped chip 20 from the pickup flipping collet 30 to bond the received chip 20 to the circuit board 65 fixed by suctioning on the bonding stage 60.

The pickup flipping collet 30 includes a collet main body 31 as a holding member having a suction surface 32 to which the chip 20 is suctioned, and a rotation-movement shaft 33 to which an end of the collet main body 31 on a side opposite of the suction surface 32 is attached. The rotation-movement shaft 33 is moved up, down, left, or right, or rotated about a central axis by a rotation-movement mechanism that is not depicted. The pickup flipping collet 30 is configured to cause the collet main body 31 to be moved up, down, left, or right, or to be rotated about the rotation-movement shaft 33, by having the rotation-movement mechanism move the rotation-movement shaft 33 up, down, left, or right, or rotate the rotation-movement shaft 33.

Figure 2:
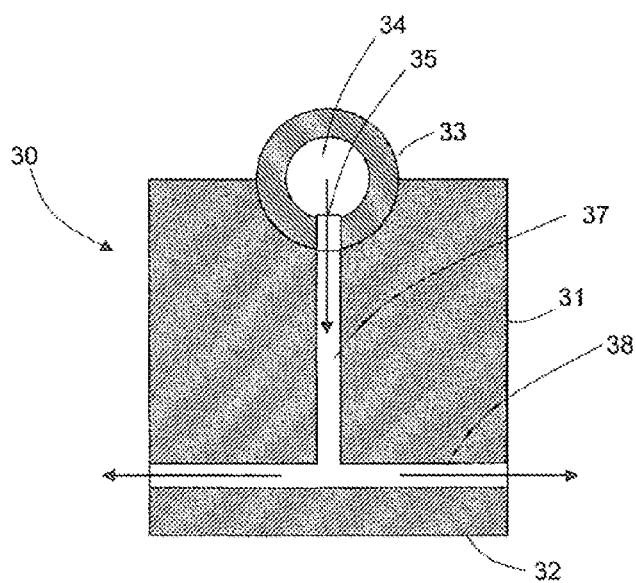
FIG. 2 is a sectional view illustrating a pickup flipping collet of the flip chip bonder shown in FIG. 1.

Referring to FIG. 2, the rotation-movement shaft 33 includes a cylindrical cooling air channel 34 extending axially along and within the rotation-movement shaft 33, and a cooling air nozzle 35 extending from the cooling air channel 34 in a radial direction of the rotation-movement shaft 33. The collet main body 31 is provided with: a first cooling air channel 37 that communicates with the cooling air nozzle 35 and extends from the rotation-movement shaft 33 toward the suction surface 32 of the collet main body 31; and a second cooling air channel 38 that communicates with the first cooling air channel 37 and extends in a direction along the suction surface 32. As illustrated in FIG. 2, cooling air that has entered the cooling air channel 34 within the rotation-movement shaft 33 cools the collet main body 31 by flowing through the collet main body 31 from the cooling air nozzle 35 through the first cooling air channel 37 and the second cooling air channel 38, and then flows out of the collet main body 31. In the described embodiment, the collet main body 31 is cooled by but not limited to cooling air, and liquid such as water can be used as a cooling medium. The cooling air channel 34, the cooling air nozzle 35, the first cooling air channel 37, and the second cooling air channel 38 constitute a cooling mechanism.

As illustrated in FIG. 1, the bonding tool 50 is attached to a bonding head 40, and moved horizontally and vertically by the bonding head 40. Further, the bonding tool 50 includes a suction surface 51 at a tip for suctioning the chip 20 (a lower surface in FIG. 1), and contains a pulse heater that is not depicted and configured to heat the chip 20 up to a temperature at which bumps provided on the chip 20 can melt (300° C. to 350° C.).

In the following, with reference to FIG. 3 and FIG. 4, a process in which the chip 20 is bonded to the circuit board 65 by the flip chip bonder 101 according to this embodiment will be described. Here, in order to make comparison with a bonding process by a conventional flip chip bonder in which the collet main body 31 of the pickup flipping collet 30 is not cooled, FIG. 4 shows a dashed line a representing a change in a temperature TB of the bonding tool 50 when flip chip bonding is performed using the conventional flip chip bonder, as well as time for bonding cycles indicated by time t11 to time t16. Comparison between the flip chip bonder according to the conventional technique and the flip chip bonder 101 according to this embodiment will be made after the bonding process by the flip chip bonder according to the conventional technique is described with reference to FIG. 5.

Figure 3:
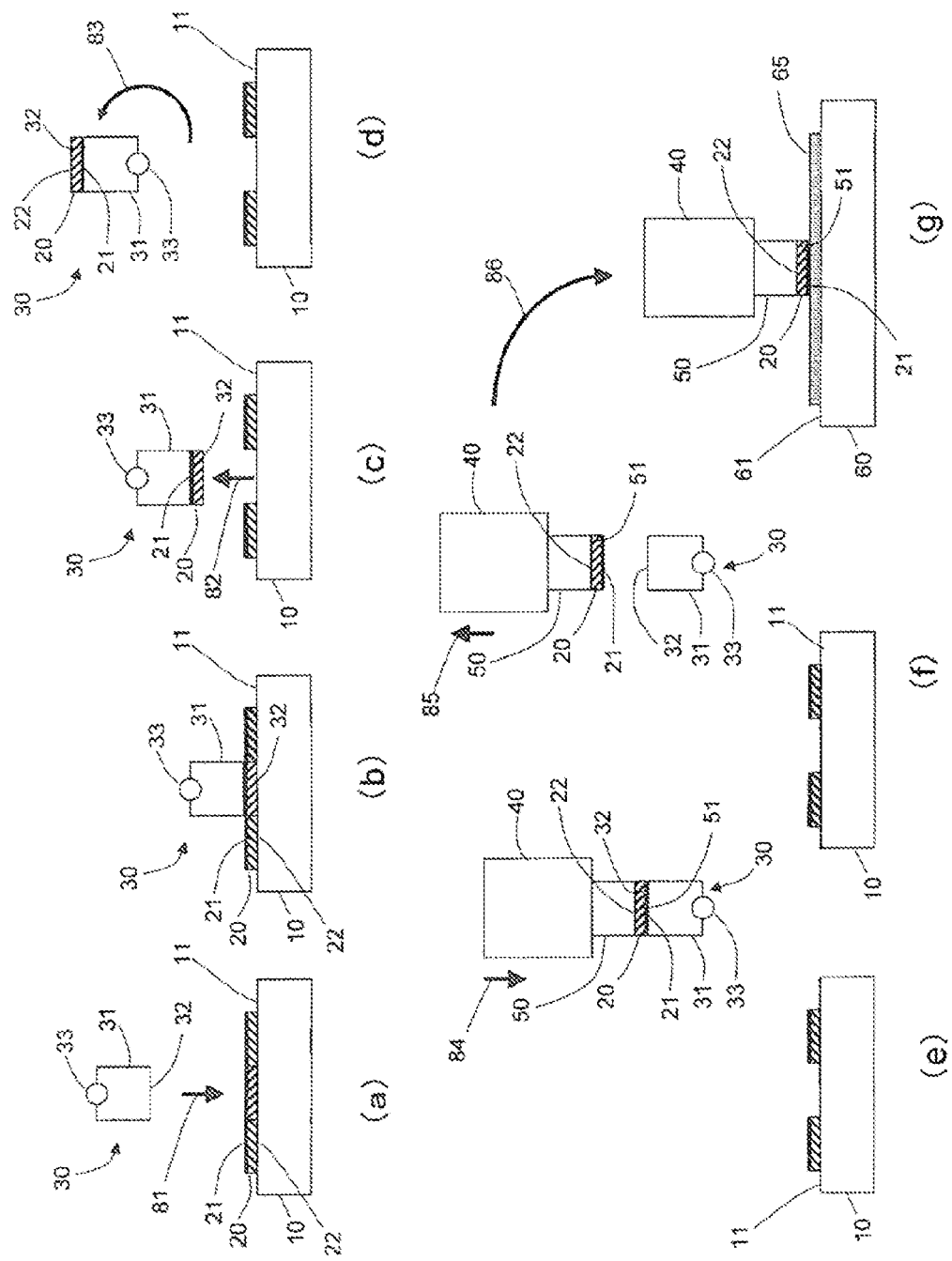
FIG. 3 is a flow diagram illustrating a bonding process by the flip chip bonder of the embodiment according to the present invention.
Figure 4:
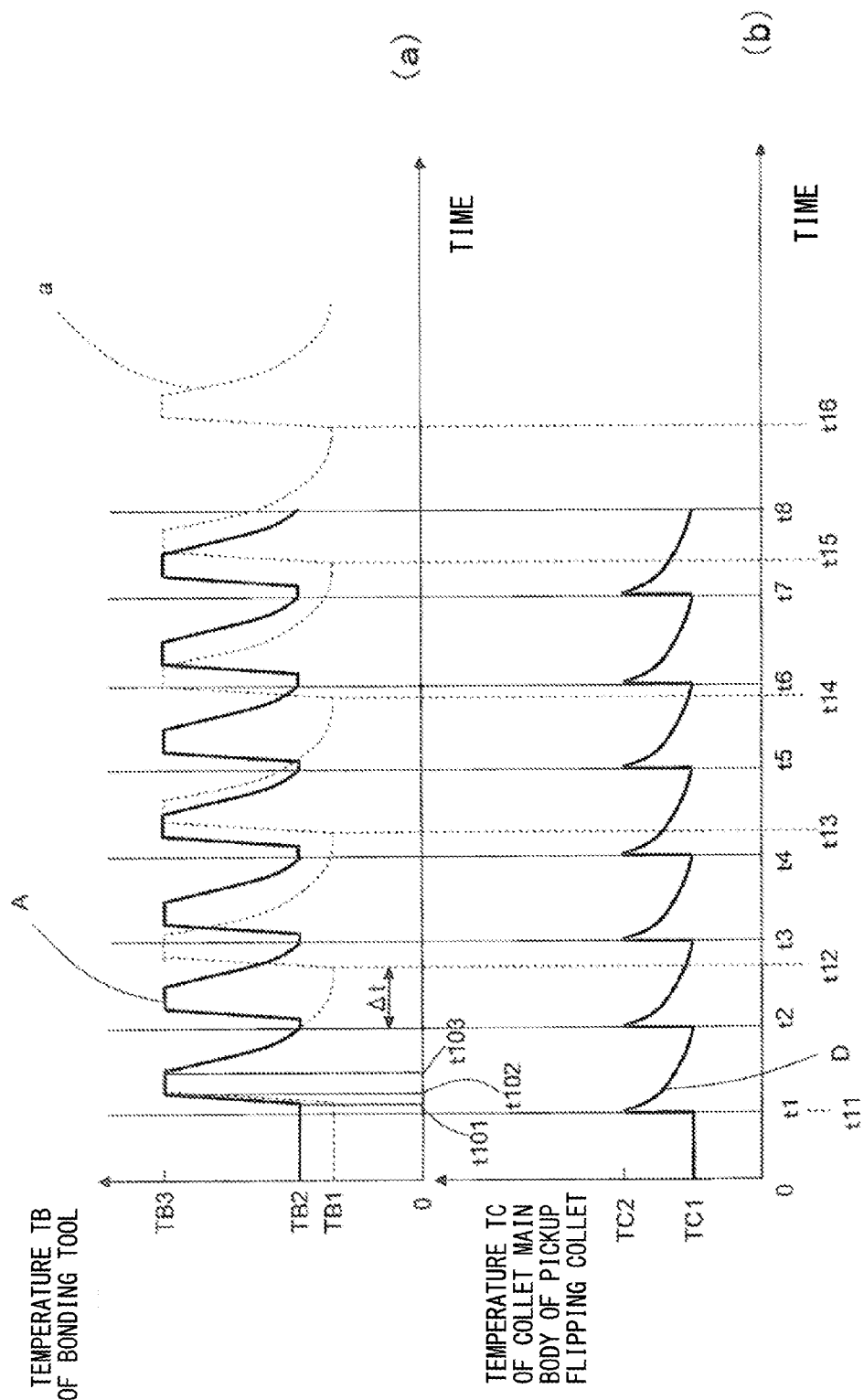
FIG. 4 is a chart showing changes in temperatures of a bonding tool and a pickup flipping collet in the bonding process by the flip chip bonder according to the present invention.

Referring to FIG. 3(a), the upper surface 11 of the pick-up stage 10 holds the chip 20 that has been diced from a wafer. On a bonding surface of the chip 20 (an upper surface in FIG. 3), bumps that are not depicted are provided and the non-conductive film (NCF) 21 is applied. First, as indicated by an arrow 81 in FIG. 3(a), the pickup flipping collet 30 is moved down to a bonding surface of the chip 20 that is to be picked up. As described with reference to FIG. 2, the pickup flipping collet 30 is cooled by the cooling air flowing through the cooling air channel 34 and the cooling air nozzle 35 of the rotation-movement shaft 33, the first cooling air channel 37, and the second cooling air channel 38, and a temperature TC of the collet main body 31 of the pickup flipping collet 30 is at a temperature TC1 at an initial state shown in FIG. 4(b) (e.g., about 30° C.).

As shown in FIG. 3(b), as the pickup flipping collet 30 moves down toward the chip 20, and the suction surface 32 at the tip of the collet main body 31 is brought into contact with the non-conductive film (NCF) 21 attached to the bonding surface of the chip 20, the non-conductive film (NCF) 21 is suctioned to the suction surface 32 of the collet main body 31. At this time, the temperature TC of the collet main body 31 is at the temperature TC1 (e.g., about 30° C.) that is lower than a melting temperature of the non-conductive film (NCF) 21 (60° C. to 70° C.). Therefore, the non-conductive film (NCF) 21 does not melt even if the non-conductive film (NCF) 21 is suctioned to the suction surface 32.

As shown in FIG. 3(c), as the pickup flipping collet 30 is moved upward as indicated by an arrow 82, the chip 20 is picked up from the upper surface 11 of the pick-up stage 10 along with the non-conductive film (NCF) 21.

As shown in FIG. 3(d), upon picking up of the chip 20, the chip 20 is flipped by rotating the rotation-movement shaft 33 of the pickup flipping collet 30 by 180 degrees along a direction of an arrow 83 in FIG. 3(d) to make the suction surface 32 of the collet main body 31 face upward, such that the surface 22 of the chip 20 (the side opposite of the bonding surface to which the non-conductive film (NCF) 21 is applied) faces upward in FIG. 3(d).

As shown in FIG. 3(e), the pickup flipping collet 30 is moved to a position for transferring the chip 20 to the bonding tool 50, in a state in which the pickup flipping collet 30 holds the chip 20 while maintaining the suction surface 32 of the pickup flipping collet 30 facing up. When the pickup flipping collet 30 is moved to the position for transferring the chip 20, at time t1 shown in FIG. 4(b), the bonding head 40 brings the suction surface 51 at the tip of the bonding tool 50 into contact with the surface 22 of the chip 20 (the side opposite of the bonding surface to which the non-conductive film (NCF) 21 is applied). Then, the chip 20 is passed from the suction surface 32 of the pickup flipping collet 30 to the suction surface 51 of the bonding tool 50 by stopping the fixation by suctioning of the chip 20 with the pickup flipping collet 30 and starting suctioning of the chip 20 with the bonding tool 50.

The temperature TB of the bonding tool 50 at time t1 shown in FIG. 4(b) is at a temperature TB2 as indicated by a solid line in FIG. 4(a). The temperature TB2 is a temperature higher than the initial temperature TC1 (about 30° C.) of the collet main body 31 of the pickup flipping collet 30, and for example, about 100° C. Then, at time t1, when the suction surface 51 at the tip of the bonding tool 50 is bought into contact with the surface 22 of the chip 20 (the side opposite of the bonding surface to which the non-conductive film (NCF) 21 is applied), heat is transferred from the high-temperature bonding tool 50 to the pickup flipping collet 30 via the chip 20, and the temperature of the collet main body 31 quickly increases from the temperature TC1 at the initial temperature (about 30° C.). During a very short period of time in which the chip 20 is passed from the suction surface 32 of the pickup flipping collet 30 to the suction surface 51 of the bonding tool 50 (e.g., 0.1 to 0.2 seconds), the temperature of the collet main body 31 increases up to a temperature TC2 (about 50° C.), as shown in FIG. 4(b). As the temperature TC2 (about 50° C.) is lower than the melting temperature of the non-conductive film (NCF) 21 (60° C. to 70° C.), the non-conductive film (NCF) does not melt while the chip 20 is passed from the suction surface 32 of the pickup flipping collet 30 to the suction surface 51 of the bonding tool 50, and therefore a molten resin is not attached to the suction surface 32 of the collet main body 31.

After the bonding tool 50 receives the chip 20 from the pickup flipping collet 30 at time t1 in FIG. 4(a), the bonding head 40 moves the bonding tool 50 upward as shown in FIG. 3(f), and at time t101 in FIG. 4(a), the chip 20 is pressed against a predetermined position on the circuit board 65 that is fixed by suctioning onto the bonding stage 60 as shown in FIG. 3(g). Then, from time t101 to time t102 in FIG. 4(a), the bonding tool 50 increases its temperature by the built-in pulse heater up to a temperature at which bumps provided on the chip 20 can become molten (300° C. to 350° C.). Thereafter, from time t102 to time t103 in FIG. 4(a), the bonding head 40 causes the bonding tool 50 at high temperature (300° C. to 350° C.) to heat and press the chip 20 and the non-conductive film (NCF) 21, and makes the bumps provided on the chip 20 and the non-conductive film (NCF) 21 melt. Subsequently, the bonding head 40 stops suctioning of the chip 20 with the bonding tool 50, as well as the pulse heater contained in the bonding tool 50, and moves the bonding tool 50 upward. At this time, the flip chip bonder 101 according to this embodiment cools the bonding tool 50 by a cooling device that is not depicted. Then, at time t103 in FIG. 4(a), the temperature TB of the bonding tool 50 starts to drop. The temperature TB is drops down to the temperature TB2 at the initial temperature (about 100° C.) at time t2 in FIG. 4(b).

In contrast, as described with reference to FIG. 2, the collet main body 31 of the pickup flipping collet 30 is cooled by cooling air flowing through the cooling air channel 34 and the cooling air nozzle 35 of the rotation-movement shaft 33, the first cooling air channel 37, and the second cooling air channel 38. Therefore, after the chip 20 is passed to the bonding tool 50 at time t1 in FIG. 4(b) and the bonding tool 50 is moved away from the collet main body 31, the collet main body 31 stops receiving heat from the bonding tool 50 as shown in FIG. 3(f), and its temperature decreases as indicated by a line D in FIG. 4(b). Then, the temperature TC of the collet main body 31 decreases down to the initial temperature TC1 (about 30° C.) at time t2 in FIG. 4(b).

Thereafter, a large number of chips 20 are sequentially joined onto the circuit board 65 by repeating the steps of bonding of picking and flipping the chip 20 with the pickup flipping collet 30 decreased down to the initial temperature TC1 (about 30° C.), and by passing the chip 20 to the bonding tool 50 at an initial temperature TB1 (about 100° C.).

Next, with reference to FIG. 5, changes in a temperature of the bonding tool 50 and the temperature TC of the collet main body 31 of the pickup flipping collet 30 in flip chip bonding performed by the conventional flip chip bonder without cooling the collet main body 31 of the pickup flipping collet 30 will be described.

Figure 5:
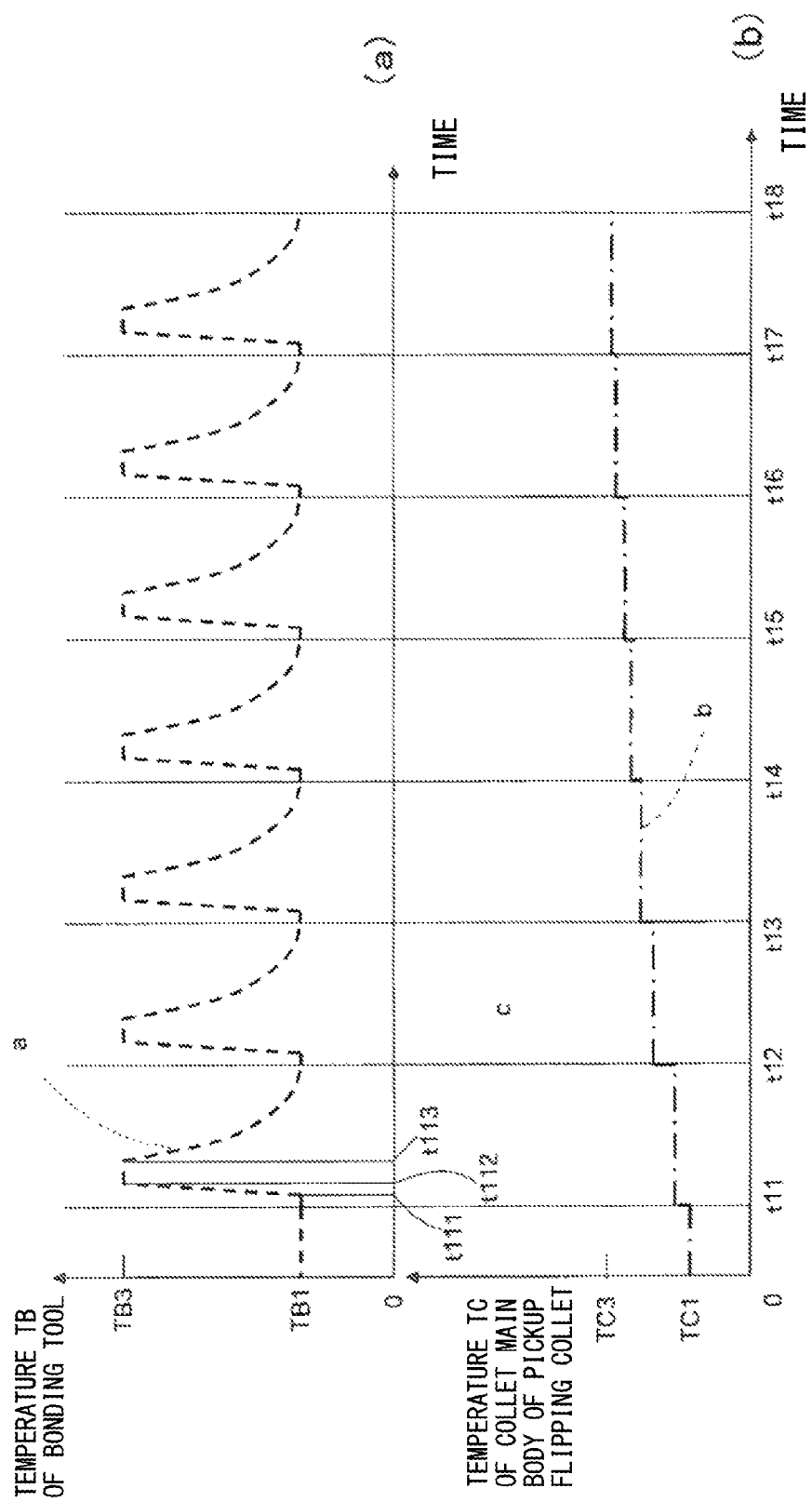
FIG. 5 is a chart showing changes in temperatures of a bonding tool and a pickup flipping collet in a bonding process by a flip chip bonder according to the conventional technique.

In a case of the conventional flip chip bonder without cooling the collet main body 31 of the pickup flipping collet 30 as illustrated in FIG. 5, in an initial state as shown in FIG. 5(a), the temperature TB of the bonding tool 50 is cooled down to the temperature TB1 (about 50° C.) that is lower than the melting temperature of the non-conductive film (NCF) 21 (60° C. to 70° C.). In contrast, in the initial state, the temperature TC of the collet main body 31 of the pickup flipping collet 30 is at the temperature TC1 (about 30° C.) that is as high as the room temperature, as illustrated in FIG. 5(b). Then, at time t11 in FIG. 5, when the bonding tool 50 is brought into contact with the chip 20 suctioned to the suction surface 32 of the collet main body 31 of the pickup flipping collet 30, and receives the chip 20 from the pickup flipping collet 30 as shown in FIG. 3(e), the temperature TC of the collet main body 31 slightly increases due to a temperature difference between the initial temperature TB1 of the bonding tool 50 (about 50° C.) and the initial temperature TC1 of the collet main body 31 (about 30° C.). According to the conventional flip chip bonder without cooling the collet main body 31, the chip 20 is passed to the bonding tool 50 from the pickup flipping collet 30 in a state in which the temperature TB of the bonding tool 50 is at the temperature TB1 (about 50° C.), which is lower than the temperature TB2 of the flip chip bonder 101 according to this embodiment (about 100° C.). Therefore, an increase of the temperature at this time is far smaller than the case of the flip chip bonder 101 according to this embodiment described with reference to FIG. 4(a) and FIG. 4(b).

According to the conventional technique flip chip bonder, the bonding tool 50 is brought into contact with the circuit board 65 at time t111 in FIG. 5(b), and the temperature TB of the bonding tool 50 is increased up to a temperature at which bumps provided on the chip 20 can become molten (300° C. to 350° C.) from time t111 to time t112. Then, from time t112 to time t113 in FIG. 5(a), the bonding tool 50 at high temperature (300° C. to 350° C.) heats and presses the chip 20 and the non-conductive film (NCF) 21, and makes the bumps provided on the chip 20 and the non-conductive film (NCF) 21 melt. Subsequently, the bonding head 40 stops suctioning of the chip 20 with the bonding tool 50, as well as the pulse heater contained in the bonding tool 50, and moves the bonding tool 50 upward. At this time, the flip chip bonder according to the conventional technique also cools the bonding tool 50 by a cooling device that is not depicted. Then, at time t113 in FIG. 5(a), the temperature TB of the bonding tool 50 starts to drop. The temperature TB drops down to the initial temperature TB1 (about 50° C.) at time t12 in FIG. 5(b).

In contrast, the flip chip bonder according to the conventional technique does not cool the collet main body 31 of the pickup flipping collet 30. Accordingly, even if the chip 20 has been passed from the pickup flipping collet 30 to the bonding tool 50 at time t11 in FIG. 5(b), the temperature of the collet main body 31 hardly drops, and remains at a temperature slightly higher than the initial temperature TC1 (about 30° C.). Consequently, as indicated by an alternate long and short dash line b in FIG. 5(b), from time t12 to time t18, the temperature of the collet main body 31 gradually increases every time when the chip 20 is passed from the pickup flipping collet 30 to the bonding tool 50, finally up to a temperature TC3. The temperature TC3 is the same temperature as the temperature TB1 (about 50° C.) at which the chip 20 of the bonding tool 50 is received.

Consequently, according to the flip chip bonder according to the conventional technique without cooling the collet main body 31, it is necessary to decrease the temperature of the bonding tool 50 for receiving semiconductor from 300° C. to 350° C. during bonding down to the temperature TB1 (about 50° C.). However, as the bonding tool 50 is generally cooled by blowing of air at room temperature (about 25° C. to 30° C.), there is a large difference in the cooling time between a case of decreasing the temperature down to the temperature TB1 (about 50° C.) and a case of decreasing the temperature down to the temperature TB2 (about 100° C.) as in the flip chip bonder according to this embodiment.

Next, differences between the bonding processes by the flip chip bonder according to the conventional technique without cooling the collet main body 31 and by the flip chip bonder 101 according to this embodiment will be described with reference to FIG. 4(a).

As indicated by a dotted line a in FIG. 4(a), a time difference Δt between time required to decrease the temperature of the bonding tool 50 of the flip chip bonder according to the conventional technique from a temperature TB3 (300-350° C.) to the temperature TB1 (about 50° C.) (from time t103 to time t12 in FIG. 4), and time required to decrease the temperature of the bonding tool 50 of the flip chip bonder 101 according to this embodiment from the temperature TB3 (300-350° C.) to the temperature TB2 (about 100° C.) (from time t103 to time t2 in FIG. 4) is about 4 to 5 seconds. Cycle time of the flip chip bonder according to the conventional technique from picking and bonding of the chip 20 until completion of cooling of the bonding tool 50 (from time t11 to time t12 in FIG. 4) is about 14 to 15 seconds. Therefore, when the collet main body 31 is cooled using the flip chip bonder 101 according to this embodiment, cycle time of the flip chip bonding (from time t1 to time t2 in FIG. 4) can be reduced to ⅔, down to about 10 seconds from 14 to 15 seconds. Further, according to the flip chip bonder 101 according to this embodiment, when the chip 20 is passed to the bonding tool 50, suction holding of the chip 20 with the pickup flipping collet 30 is released only after the bonding tool 50 is brought into contact with the chip 20 suction held by the suction surface 32 of the pickup flipping collet 30. Therefore, unlike the flip chip bonder according to the conventional technique described in the background art, it is possible to restrain displacement of the position of the chip 20 when the chip 20 is transferred, and to maintain bonding quality.

In other words, according to the flip chip bonder 101 according to this embodiment, by cooling the collet main body 31 of the pickup flipping collet 30, the temperature TB2 of the bonding tool 50 for receiving the chip 20 can be higher than that in the conventional technique, and time for cooling the bonding tool 50 after bonding can be reduced. Thus, it is possible to reduce the cycle time for flip chip bonding to a large degree.

As described above, the flip chip bonder 101 according to this embodiment provides an effect of reducing bonding time without lowering bonding quality.

Next, with reference to FIG. 6 and FIG. 7, a relation between the cooling temperature TC1 of the collet main body 31 of the pickup flipping collet 30 (the temperature TC1 of the collet main body 31 after cooling as indicated by the line D in FIG. 4(b)) and the temperature TB2 of the bonding tool 50 for receiving the chip 20 (the temperature TB2 of the bonding tool 50 after cooling as indicated by a line A in FIG. 4(a)) will be described in further detail.

The temperature of the collet main body 31 increases as indicated by the curved line D in FIG. 4(b) due to heat transfer from the high-temperature bonding tool 50 at the temperature TB2 to the low-temperature collet main body 31 at the temperature TC1 as shown in FIG. 7(a) and FIG. 7(b). Outlined arrows in FIG. 7(a) and FIG. 7(b) indicate directions of heat transfer, and the size of the arrows represents an amount of the transferred heat. Further, as the temperature TC2 of the collet main body 31 after the temperature increases comes closer to the melting temperature of the non-conductive film (NCF) 21 (60° C. to 70° C.), the non-conductive film (NCF) 21 in contact with the suction surface 32 of the collet main body 31 becomes soft and starts to melt, and the molten resin attaches to the suction surface 32 of the collet main body 31. Therefore, the temperature TC2 of the collet main body 31 after the temperature increases is set to be a temperature on the order of 50° C., at which the non-conductive film (NCF) 21 can not become soft or start to melt. In contrast, in order to reduce the cycle time of flip chip bonding, it is desirable to increase the temperature TB2 of the bonding tool 50 when receiving the chip 20 as high as possible.

Figure 6:
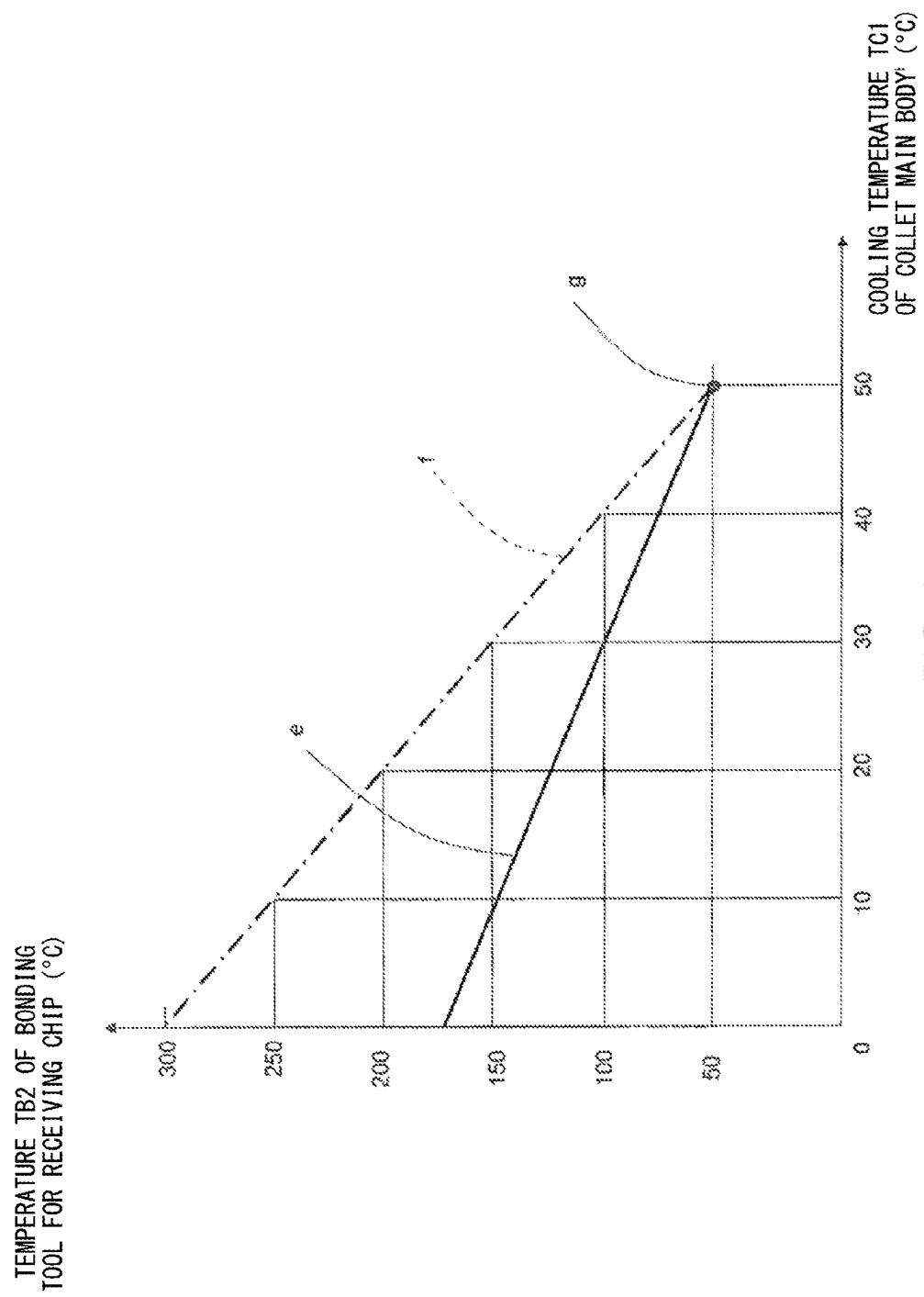
FIG. 6 is a chart showing relations between temperatures of the bonding tool for receiving a chip and temperatures of the pickup flipping collet when being cooled of the flip chip bonder according to the present invention.
Figure 7:
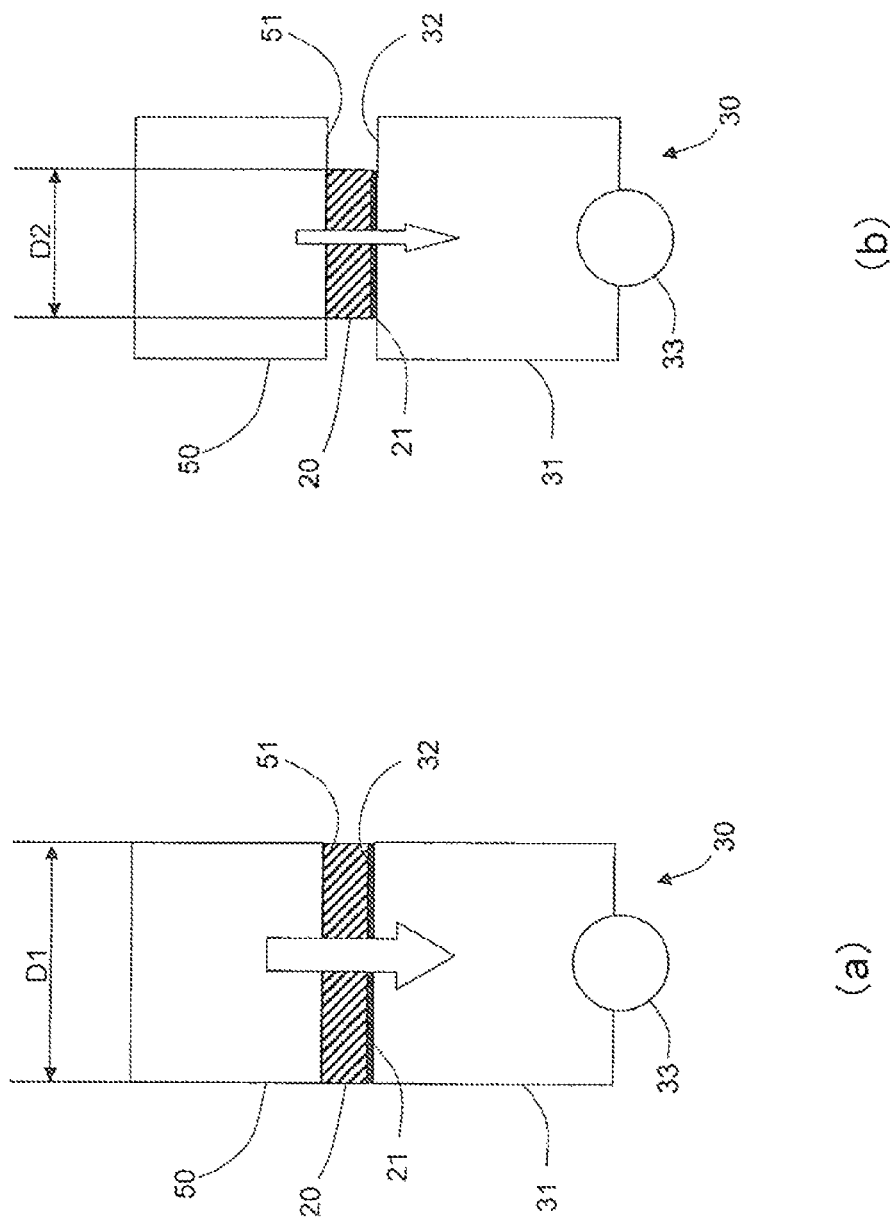
FIG. 7 is an elevational view showing sizes of the pickup flipping collet, the chip, and the bonding tool of the flip chip bonder according to the present invention.

Therefore, the cooling temperature TC1 of the collet main body 31 and the temperature TB2 of the bonding tool 50 for receiving the chip 20 can be selected based on a chart as shown in FIG. 6, for example. A line e in FIG. 6 is a line defining the relation between the cooling temperature TC1 of the collet main body 31 and the temperature TB2 of the bonding tool 50 for receiving the chip 20 in order to set the temperature TC2 of the collet main body 31 to be 50° C. or lower in a case in which as illustrated in FIG. 7(a), the width of the chip 20 to be passed is as large as D1, and an amount of heat transferred from the bonding tool 50 to the collet main body 31 when the chip 20 is transferred is large, and the temperature TC of the collet main body 31 easily increases; while a line f in FIG. 6 is a line defining the relation between the cooling temperature TC1 of the collet main body 31 and the temperature TB2 of the bonding tool 50 for receiving the chip 20 in order to set the temperature TC2 of the collet main body 31 to be 50° C. or lower in a case in which as illustrated in FIG. 7(b), the width of the chip 20 to be passed is as small as D2, and an amount of heat transferred from the bonding tool 50 to the collet main body 31 when the chip 20 is transferred is small, and the temperature TC of the collet main body 31 can not easily increase.

In a case in which the collet main body 31 is not cooled, the temperature TB2 of the bonding tool 50 for receiving the chip 20 is 50° C. (point g in FIG. 6), as described referring to the flip chip bonding according to the conventional technique. This applies regardless of the width of the chip 20, large or small.

In a case in which the collet main body 31 is cooled and the width of the chip 20 is large as shown by the line e in FIG. 6, if the cooling temperature TC1 of the collet main body 31 is 30° C., for example, the temperature of the collet main body increases only up to 50° C. even if the temperature TB2 of the bonding tool 50 for receiving the chip 20 is increased as high as 100° C. Further, in a case in which the collet main body 31 is cooled by a low-temperature medium, and the temperature of the collet main body 31 is decreased down to about 10° C., the temperature of the collet main body increases only up to 50° C. even if the temperature TB2 of the bonding tool 50 for receiving the chip 20 is increased as high as 100° C.

Moreover, in a case in which the collet main body 31 is cooled and the width of the chip 20 is small as shown by the line f in FIG. 6, if the cooling temperature TC1 of the collet main body 31 is 30° C., for example, the temperature of the collet main body increases only up to 50° C. even if the temperature TB2 of the bonding tool 50 for receiving the chip 20 is increased as high as 150° C. Further, in a case in which the collet main body 31 is cooled by a low-temperature medium, and the temperature of the collet main body 31 is decreased down to about 10° C., the temperature of the collet main body increases only up to 50° C. even if the temperature TB2 of the bonding tool 50 for receiving the chip 20 is increased as high as 250° C.

Specifically, the lower the cooling temperature TC1 of the collet main body 31 is, the higher the temperature TB2 of the bonding tool 50 for receiving the chip 20 can be made, and the shorter the cycle time for bonding can become. Further, when the size of the chip 20 to be passed is smaller, an amount of heat transferred from the bonding tool 50 to the collet main body 31 when the chip 20 is transferred becomes smaller even if the cooling temperature TC1 of the collet main body 31 is unchanged. Therefore, it is possible to further increase the temperature TB2 of the bonding tool 50 for receiving the chip 20, and to further reduce the cycle time for bonding.

When the heat capacity of the collet main body 31 is large with respect to the heat capacity of the bonding tool 50, an increase of the temperature of the collet main body 31 is smaller even if an amount of heat transferred from the bonding tool 50 to the collet main body 31 is the same. Therefore, the temperature TB2 of the bonding tool 50 for receiving the chip 20 can be made higher as the heat capacity of the collet main body 31 becomes higher with respect to the heat capacity of the bonding tool 50, and it is possible to further reduce the cycle time for bonding.

The cooling temperature TC1 of the collet main body 31 and the temperature TB2 of the bonding tool 50 for receiving the chip 20 can be determined based on an examination, taking the above characteristics into account. FIG. 6 is a schematic drawing showing characteristics of the relation between the cooling temperature TC1 of the collet main body 31 and the temperature TB2 of the bonding tool 50 for receiving the chip 20, but the relation and the characteristics can be a case other than linear as shown in FIG. 6.

Next, a different embodiment according to the present invention will be described with reference to FIG. 8 through FIG. 14. Like components as described with reference to FIG. 1 through FIG. 7 are denoted by like reference numerals, and description thereof shall be omitted.

Figure 8:
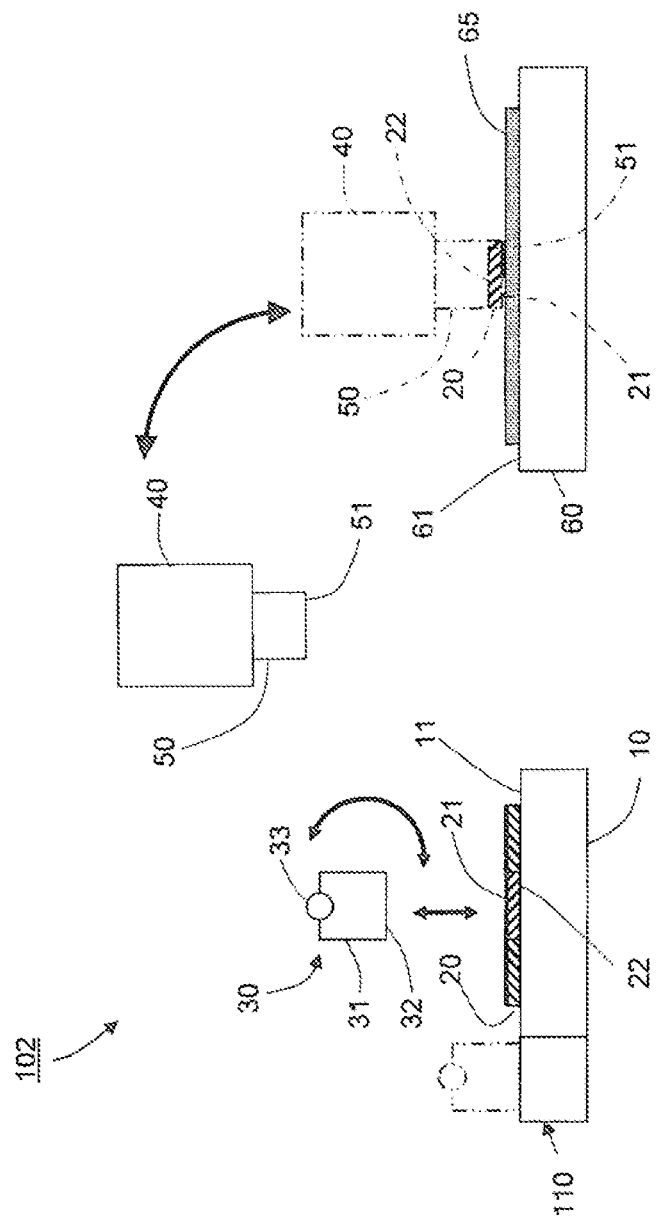
FIG. 8 is an elevational view illustrating a structure of a flip chip bonder of a different embodiment according to the present invention.

Referring to FIG. 8, a flip chip bonder 102 according to this embodiment includes a cooling stage 110 as a cooling mechanism, configured to cool the collet main body 31 by being brought into contact with the suction surface 32 of the pickup flipping collet 30.

Figure 9:
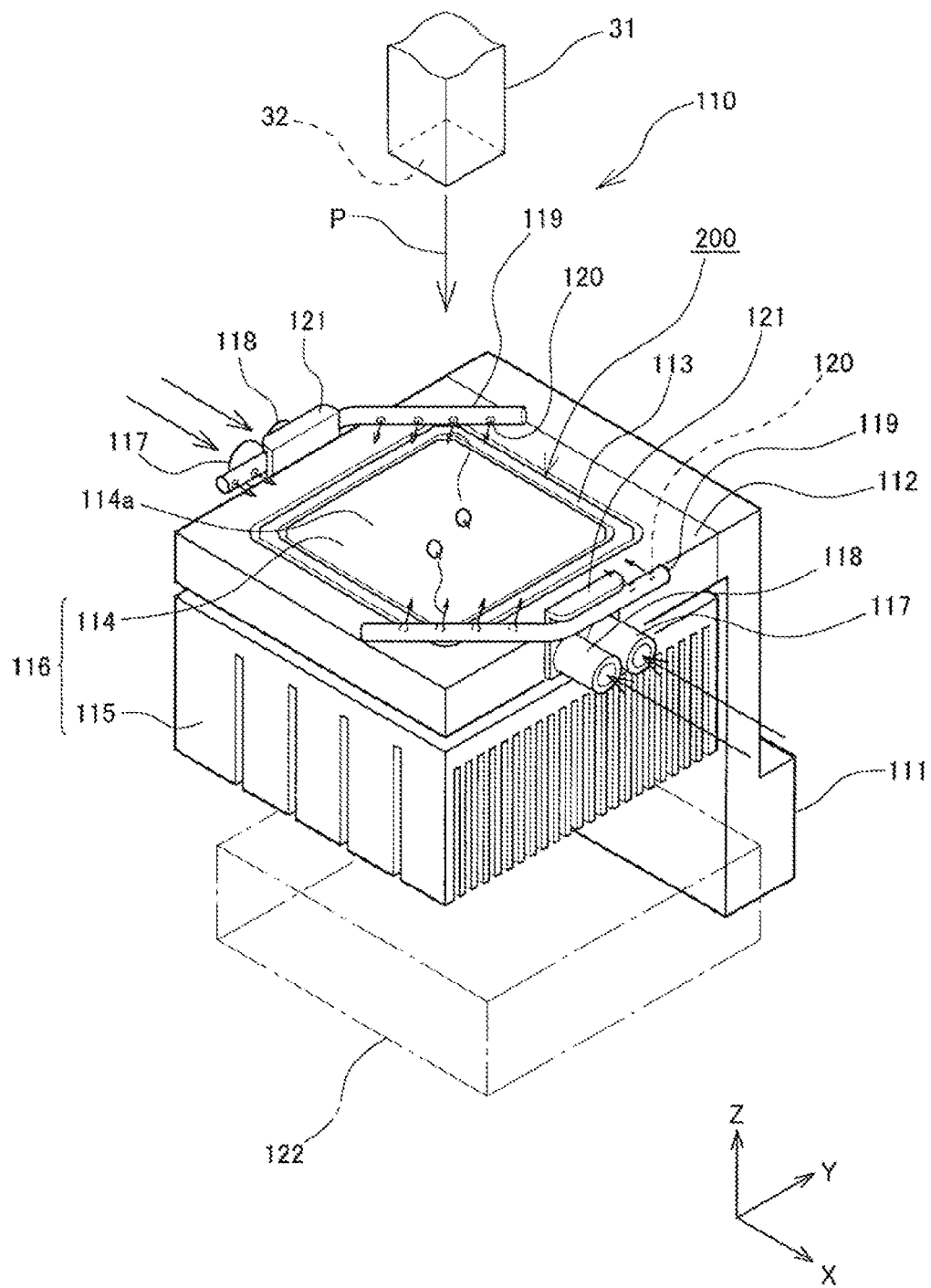
FIG. 9 is a perspective view illustrating a structure of a cooling stage of the flip chip bonder shown in FIG. 8.
Figure 10:
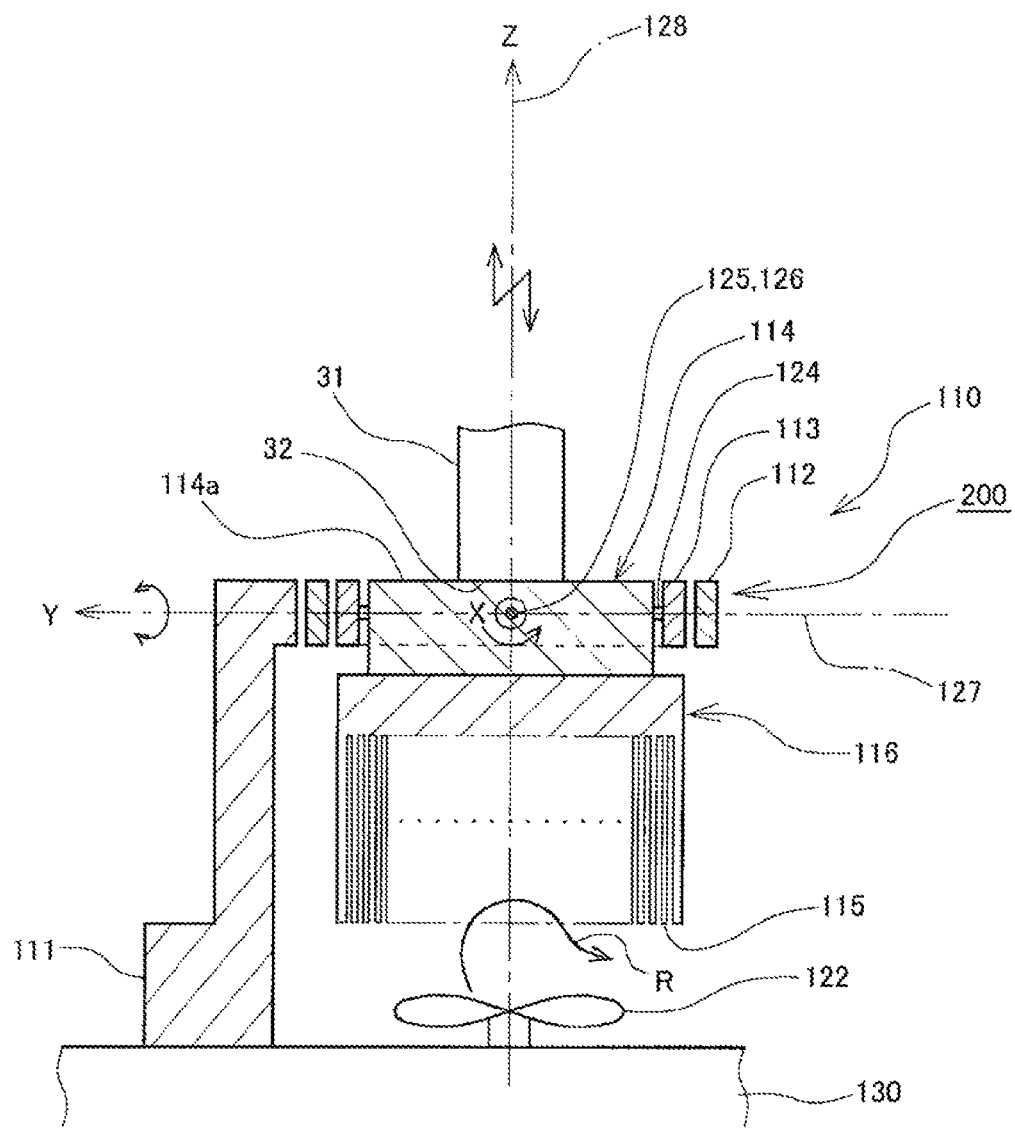
FIG. 10 is a sectional view illustrating the cooling stage of the flip chip bonder shown in FIG. 8.

Referring to FIG. 9 and FIG. 10, the cooling stage 110 is provided with: a frame 112 as a base body; and a cooling member 116 including a ground plate 114 having a ground surface 114a with which the suction surface 32 at the tip of the collet main body 31 is brought into contact, and radiator fins 115 as a radiating member attached to a side of the ground plate 114 opposite of the ground surface 114a. The ground plate 114 is attached to the frame 112, so that an orientation of the ground surface 114a is made variable by the support mechanism 200. Further, on a side surface of the frame 112, a cooling nozzle 119 attached to the frame 112 via a bracket 121 and extends along a surface of the ground surface 114a to blow cooling air out through outlets 120, and a cooling air supply pipes 117 and 118 through which cooling air is supplied to the cooling nozzle 119 are attached. In addition, under the radiator fins 115 of the cooling member 116, a cooling fan 122 configured to blow the radiator fins 115 with cooling air is provided.

Figure 11:
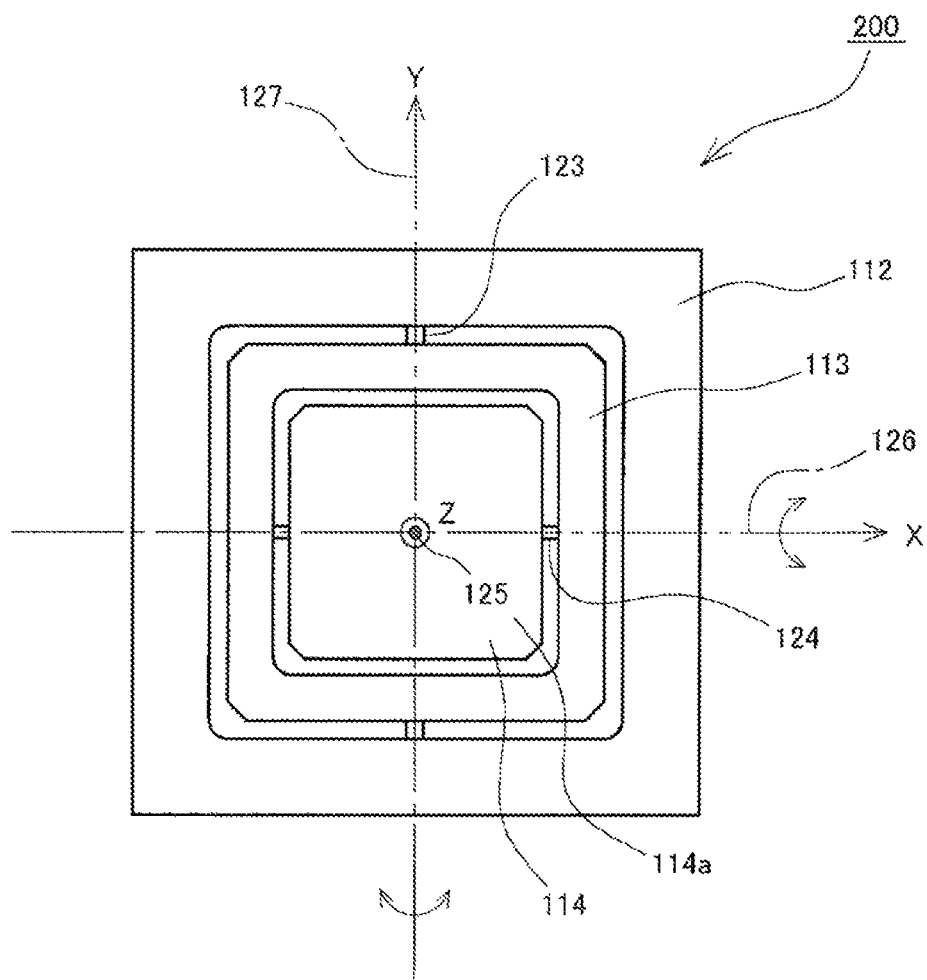
FIG. 11 is a plan view illustrating the cooling stage of the flip chip bonder shown in FIG. 8.

Referring to FIG. 10 and FIG. 11, the support mechanism 200 is configured by a square middle frame 113 and a pin 124; the square middle frame 113 is attached inside a square opening of the frame 112 by a pin 123 rotatably about a Y axis 127 as a second axis perpendicular to an X axis 126 passing a center 125 of the ground plate 114 and extending along the ground surface 114a; the pin 124 is attached inside the middle frame 113, and supports the ground plate 114 rotatably about the X axis 126 as a first axis passing the center 125 of the ground plate 114 and extending along the ground surface 114a. Therefore, the ground plate 114 is supported on the frame 112 rotatably about the X axis 126 and the Y axis 127 passing the center 125, so that an orientation or an inclination of the ground surface 114a is variable with respect to the frame 112. Further, as illustrated in FIG. 10, the radiator fins 115 are fixed to a lower surface of the ground plate 114 (a side opposite of the ground surface 114a), and moves integrally with the ground plate 114. Therefore, the cooling member 116 including the ground plate 114 and the radiator fins 115 as a whole is rotatable about the X axis 126 and the Y axis 127 passing the center 125 of the ground plate 114.

The ground surface 114a, which is a surface of the ground plate 114, has a flat surface with which the suction surface 32 of the tip of the collet main body 31 can be in close contact, and a heat capacity of the cooling member 116 including the ground plate 114 and the radiator fins 115 is larger than a heat capacity of the collet main body 31.

Figure 12:
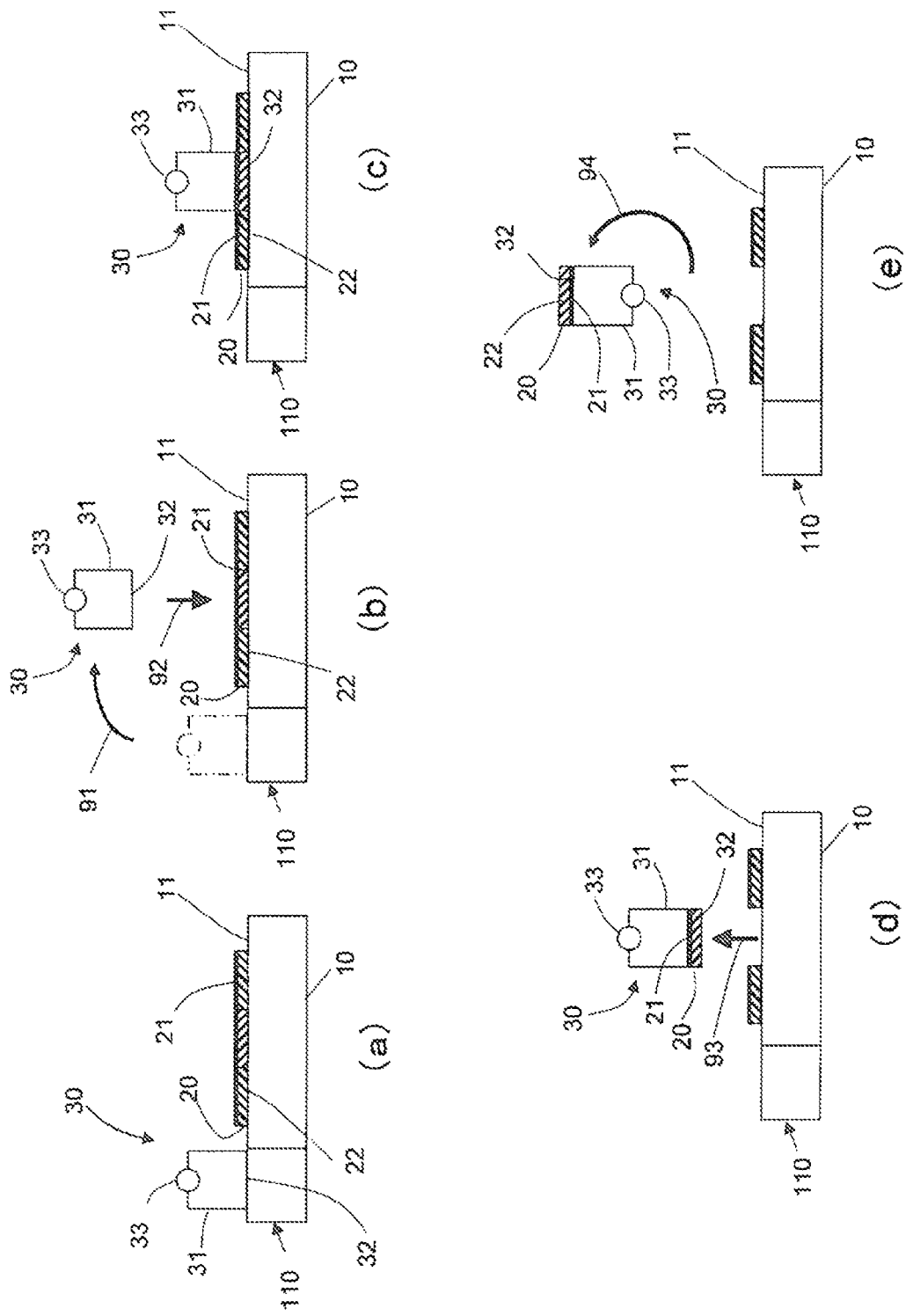
FIG. 12 is a flow diagram illustrating a bonding process by the flip chip bonder of the different embodiment according to the present invention.
Figure 13:
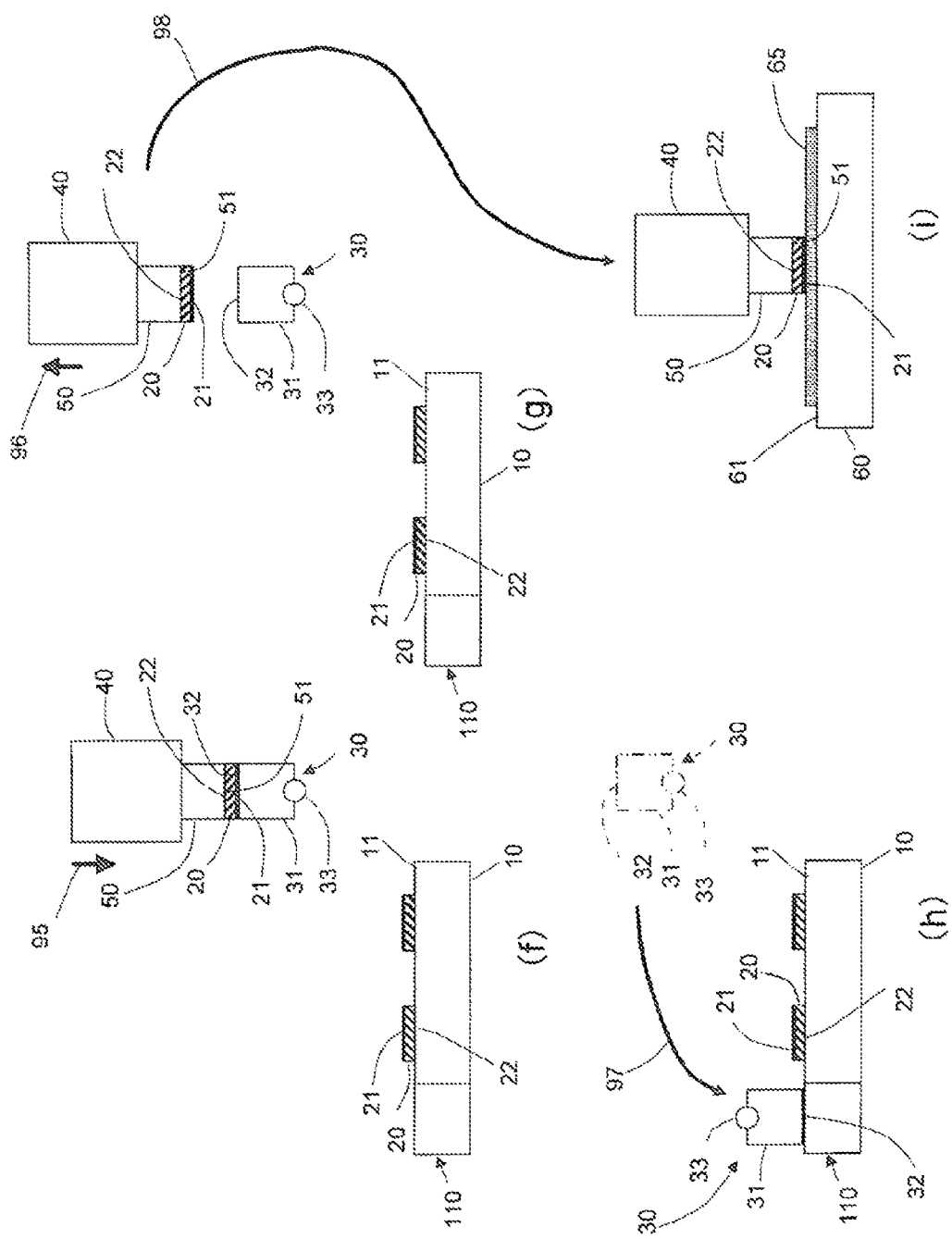
FIG. 13 is a flow diagram illustrating a bonding process by the flip chip bonder of the different embodiment according to the present invention.
Figure 14:
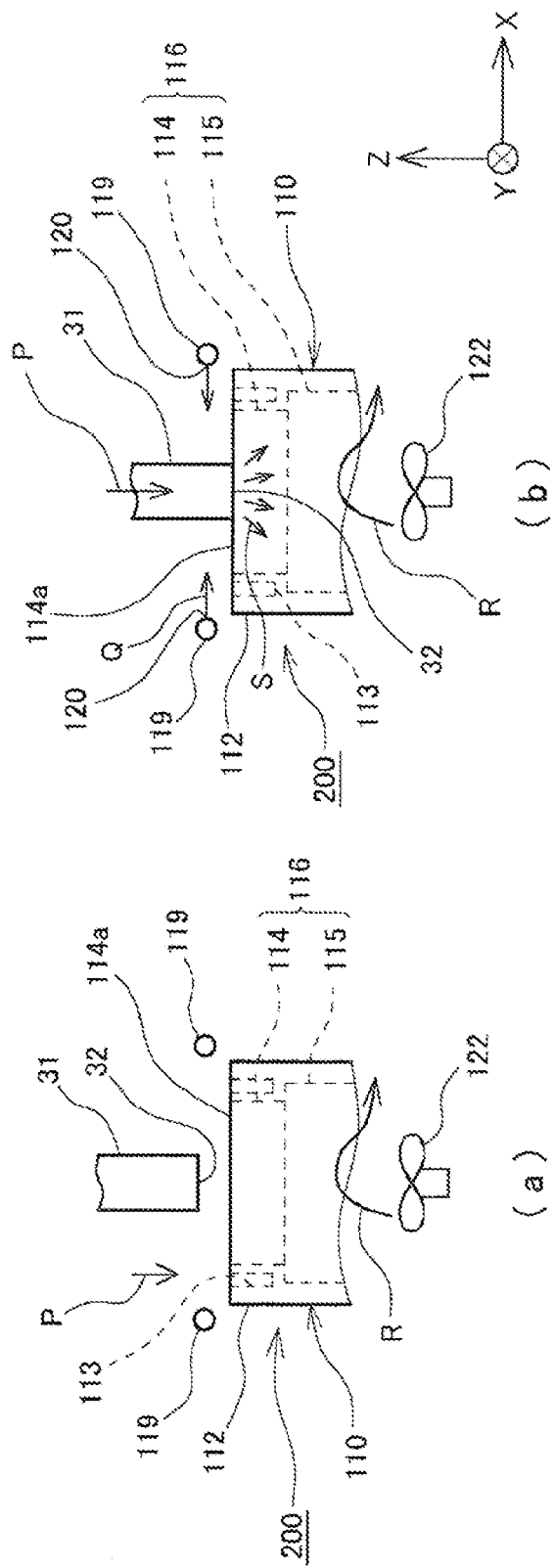
FIG. 14 is a flow diagram illustrating a bonding process by the flip chip bonder of the different embodiment according to the present invention.

A flip chip bonding operation by the flip chip bonder 102 provided with the cooling stage 110 thus configured will be described with reference to FIG. 12 through FIG. 14. Like components as described with reference to FIG. 1 through FIG. 7 are denoted by like reference numerals, and description thereof shall be omitted.

Referring to FIG. 12(a), in an initial state, the suction surface 32 of the pickup flipping collet 30 is cooled in contact with an upper surface of the cooling stage 110, and at normal temperature as high as about 30° C., for example. As indicated by an arrow 91 in FIG. 12(b), the collet main body 31 of the pickup flipping collet 30 is moved immediately above the chip 20 to be picked up by moving the rotation-movement shaft 33 up, down, left, or right by a rotation-movement mechanism that is not depicted. Then, as indicated by an arrow 92 in FIG. 12(b), the pickup flipping collet 30 is moved onto the chip 20 to be picked up. As illustrated in FIG. 12(c), when the suction surface 32 of the collet main body 31 of the pickup flipping collet 30 is brought into contact with the non-conductive film (NCF) 21 on the surface of the chip 20, the pickup flipping collet 30 suctions the non-conductive film (NCF) 21, and picks the non-conductive film (NCF) 21 and the chip 20 up as indicated by an arrow 93 in FIG. 12(d). Then, the picked chip 20 is flipped by having the collet main body 31 be rotated about the rotation-movement shaft 33 by the rotation-movement mechanism that is not depicted as indicated by an arrow 94 in FIG. 12(e), and the rotation-movement shaft 33 is moved by the rotation-movement mechanism that is not depicted. With this, the collet main body 31 is moved to a position for transferring the chip 20 to the bonding tool 50 as illustrated in FIG. 13(f). As indicated by an arrow 95 in FIG. 13(f), the bonding head 40 causes the suction surface 51 of the bonding tool 50 to be brought into contact with the surface 22 of the chip 20 (the side opposite of the bonding surface to which the non-conductive film (NCF) 21 is applied) that is suctioned and held on the suction surface 32 of the collet main body 31 in a flipped state, to suction the chip 20, and to receive the chip 20 from the collet main body 31 of the pickup flipping collet 30. When the chip 20 is transferred, the temperature TC of the collet main body 31 increases from the initial temperature TC1 about 30° C. to the temperature TC2 about 50° C. as shown at time t1 in FIG. 4(b). As indicated by an arrow 98 in FIG. 13(i), the bonding head 40 brings the bonding tool 50 into contact with a predetermined position on the circuit board 65 fixed to the bonding stage 60. Then, the bonding tool 50 is heated by the pulse heater contained in the bonding tool 50 to melt the bumps and the non-conductive film (NCF) on the chip 20, and bonds the chip 20 onto the circuit board 65.

As described with reference to FIG. 4(b), the temperature of the collet main body 31 after the chip 20 is passed is the temperature TC2 at about 50° C. As indicated by an arrow 97 in FIG. 13(h), the rotation-movement mechanism rotates the rotation-movement shaft 33, so that the suction surface 32 faces downward and moves the center of the collet main body 31 to the center of the cooling stage 110. As illustrated in FIG. 14(a), the cooling fan 122 of the cooling stage 110 is rotating and sending cooling air to the radiator fins 115 as indicated by an arrow R in the figure. Therefore, the ground plate 114 and the radiator fins 115 are substantially at normal temperature.

The collet main body 31 is moved downward (to a negative side in the Z direction) as indicated by an arrow P in FIG. 14(b), and the suction surface 32 of the collet main body 31 is brought into contact with the ground surface 114a of the ground plate 114. As described with reference to FIG. 10 and FIG. 11, the ground plate 114 is attached to the frame 112 by the support mechanism 200 so as to be rotatable with respect to the frame 112 about the X axis 126 and the Y axis 127 passing the center 125 of the ground plate 114. Therefore, the ground surface 114a (a direction of the ground surface 114a) freely rotates about the X axis 126 and the Y axis 127 with its inclination following the inclination of the suction surface 32 of the collet main body 31 (the direction of the tip surface). As a result, the suction surface 32 of the collet main body 31 is brought into close contact with the ground surface 114a. As the ground plate 114 is fixed integrally with the radiator fins 115, when the suction surface 32 of the collet main body 31 is brought into close contact with the ground surface 114a, the heat of the collet main body 31 is transferred, as indicated by an arrow S in FIG. 14(b), toward the ground plate 114 and the radiator fins 115 maintained at normal temperature. As the heat capacity of the cooling member 116 including the ground plate 114 and the radiator fins 115 is configured to be larger than a heat capacity of the collet main body 31, the temperature of the collet main body 31 quickly drops. Further, while the suction surface 32 of the collet main body 31 is in close contact with the ground surface 114a of the ground plate 114, cooling air is blown out from the outlet holes 120 provided along the cooling nozzle 119 attached to the side of the frame 112 in a direction along the ground surface 114a (a direction indicated by an arrow Q) to be sent to the tip of the collet main body 31, and thus the cooling is also performed from an outer surface of the collet main body 31.

By bringing the collet main body 31 into contact with the ground surface 114a of the ground plate 114 for a predetermined period of time, the temperature of the collet main body 31 decreases down to the initial temperature TC1 shown in FIG. 4(b). As illustrated in FIG. 14(a), the cooling fan 122 of the cooling stage 110 keeps sending cooling air to the radiator fins 115 even after the suction surface 32 of the collet main body 31 moves away from the ground surface 114a of the ground plate 114. Therefore, the cooling member 116 configured by the ground plate 114 and the radiator fins 115 is cooled down to the initial temperature TC1 while the bonding tool 50 performs bonding of the chip 20.

Upon finishing of the cooling, as illustrated in FIG. 12(b), the collet is moved above the chip 20 to be picked up next and performs pick-up and bonding of the chip 20 to be picked up next.

Similarly to the flip chip bonder 101 according to the embodiment described with reference to FIG. 1 through FIG. 7, the flip chip bonder 102 according to this embodiment provides an effect of reducing bonding time without lowering bonding quality.

In the above description of the flip chip bonder 102 according to the embodiment described with reference to FIG. 8 through FIG. 14, the cooling stage 110 is attached to the frame 112 as illustrated in FIG. 10 and FIG. 11, by the support mechanism 200 as a combination of the two pins 123 and 124 and the middle frame 113, and the ground plate 114 is rotatable about the X axis and the Y axis. However, as long as the ground plate 114 is rotatable about the X axis and the Y axis, a configuration described below can be employed.

Figure 15:
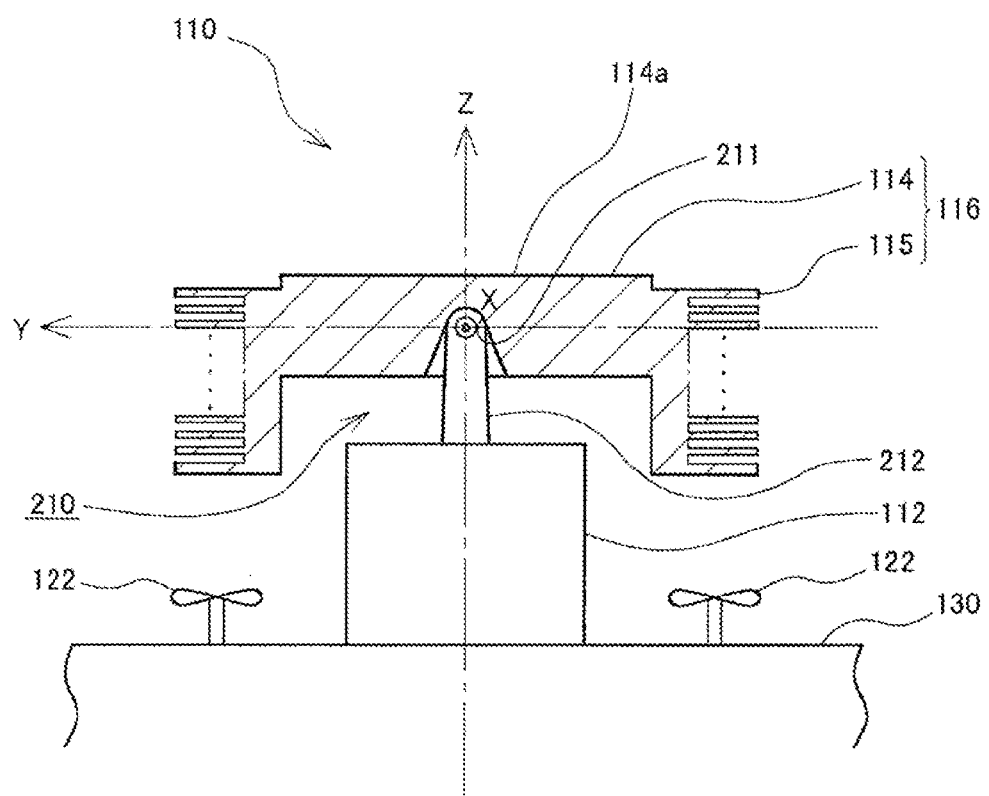
FIG. 15 is a sectional view illustrating a structure of a different cooling stage of the flip chip bonder shown in FIG. 8.
Figure 16:
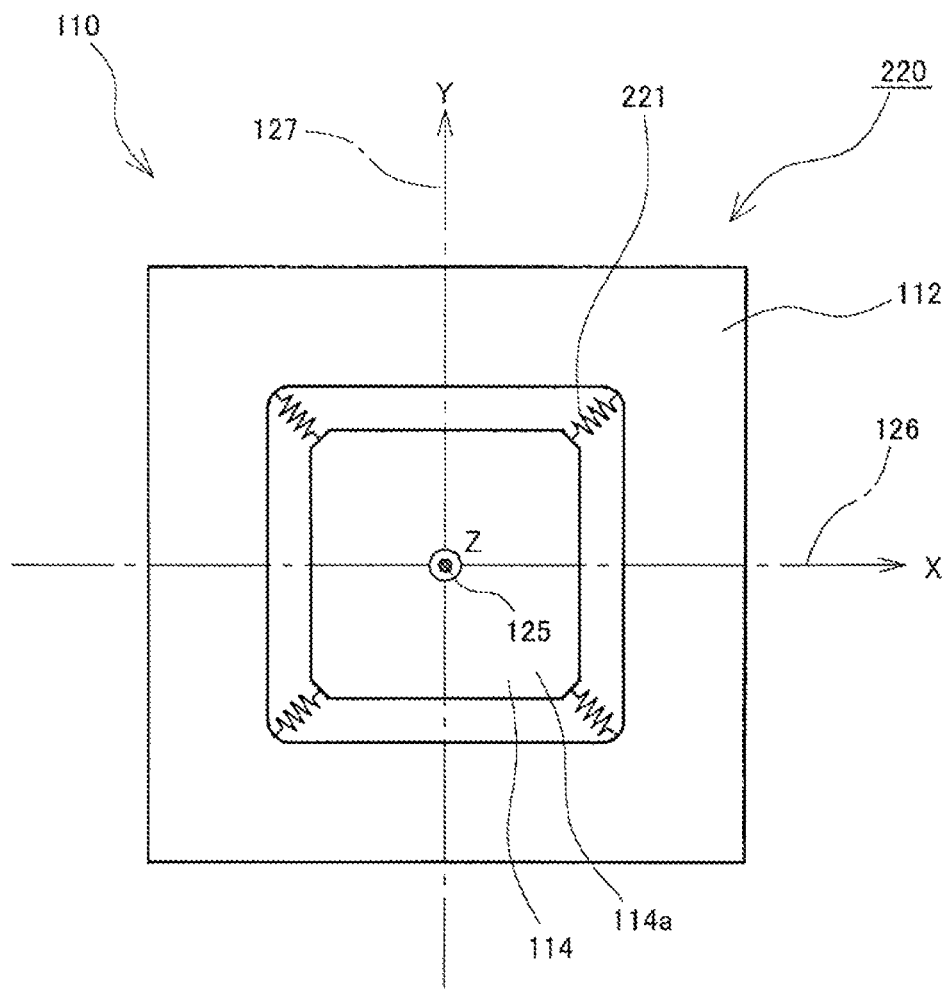
FIG. 16 is a plan view illustrating a structure of the different cooling stage of the flip chip bonder shown in FIG. 8.

A different configuration of the cooling stage 110 will be described with reference to FIG. 15 and FIG. 16. Like components as in the embodiment described with reference to FIG. 9 through FIG. 11 are denoted by like reference numerals, and description thereof shall be omitted. The cooling stage 110 illustrated in FIG. 15 is supported by, in place of the support mechanism 200 for the cooling stage 110 described with reference to FIG. 9 through FIG. 11, a pivot support mechanism 210 having a support pin 212 provided for the frame 112 that supports the ground plate 114 at a dimple 211 in its lower surface. Further, the cooling stage 110 illustrated in FIG. 16 is supported by a spring support mechanism 220 having springs 221 that support the ground plate 114 at four corners. Moreover, unlike the pivot support mechanism 210 for the cooling stage 110 illustrated in FIG. 15, the ground plate 114 can be supported by a spherical base provided for the frame 112 at the spherical dimple provided in the lower surface of the ground plate 114. The cooling stage 110 illustrated in FIG. 15 or FIG. 16 is rotatable about the X axis and the Y axis, as well as about a Z axis. Furthermore, it is sufficient that the radiator fins 115 are provided integrally with the ground plate 114 so as to be able to release heat of the ground plate 114, and the radiator fins 115 can be provided on a side of the ground plate 114 as illustrated in FIG. 15. In addition, the cooling member 116 is not have to be the radiator fins 115, and can be configured to perform cooling using a cooling medium other than air, for example, by having cooling water flow inside.

In the above description of the flip chip bonder 102 according to the embodiment described with reference to FIG. 8 through FIG. 16, the collet main body 31 of the pickup flipping collet 30 is cooled by the cooling stage 110. However, the bonding tool 50 can be cooled, similarly to the collet main body 31, by providing an additional cooling stage having the same configuration as the cooling stage 110 to cool the bonding tool 50 by bringing the suction surface 51 at the tip of the bonding tool 50 into close contact.

Figure 17:
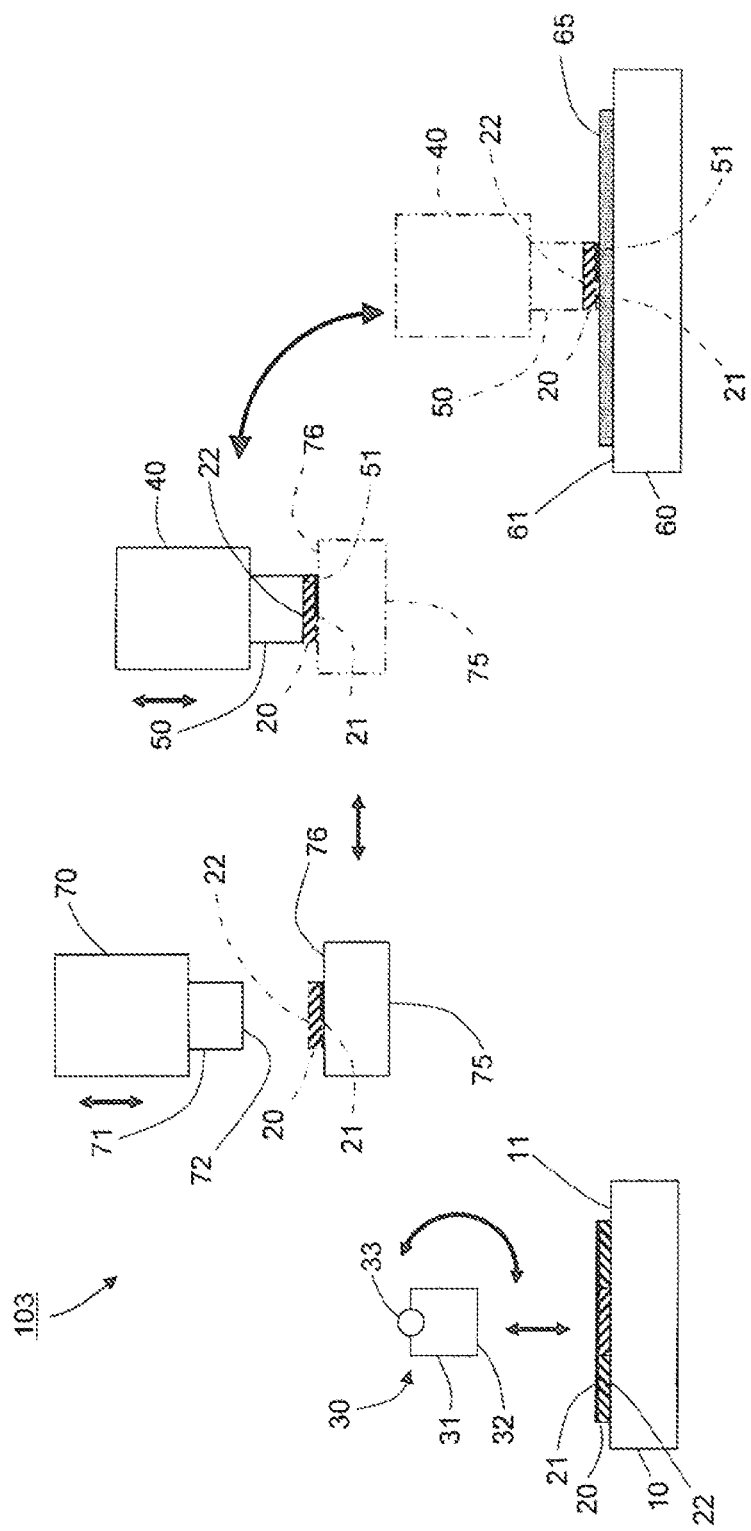
FIG. 17 is an elevational view illustrating a structure of a flip chip bonder of a different embodiment according to the present invention.

Next, a different embodiment according to the present invention will be described with reference to FIG. 17 and FIG. 18. Like components as in the embodiment described with reference to FIG. 1 through FIG. 7 are denoted by like reference numerals, and description thereof shall be omitted. As illustrated in FIG. 17, with a flip chip bonder 103 according to this embodiment, the chip 20 flipped with the pickup flipping collet 30 is not directly passed to the bonding tool 50, but the chip 20 flipped with the pickup flipping collet 30 is received by a collet 71 attached to a transfer head 70, and placed on a surface 76 of a transfer stage 75, and the transfer stage 75 holds and carries the chip 20 in the flipped state to a position for transferring to the bonding tool 50. Then, the bonding tool 50 receives the chip 20 in the flipped state from the surface 76 of the transfer stage 75, and bonds the received chip 20 to the circuit board 65 fixed and suctioned to the bonding stage 60. With the flip chip bonder 103 according to this embodiment, the chip 20 is transferred between the bonding tool 50 and the transfer stage 75, and therefore the temperature of the transfer stage 75 increases from the temperature TC1 to the temperature TC2 when the chip 20 is transferred similarly to the case of the collet main body 31 illustrated in FIG. 4(b). As the collet 71 attached to the transfer head 70 is used at normal temperature, the pickup flipping collet 30 of the flip chip bonder 103 according to this embodiment is at normal temperature, and its temperature does not increase.

Therefore, in this embodiment, the pickup flipping collet 30, the transfer head 70, the collet 71, and the transfer stage 75 constitute a flip mechanism, and the transfer stage 75 constitutes a holding member configured to hold the flipped chip 20.

Figure 18:
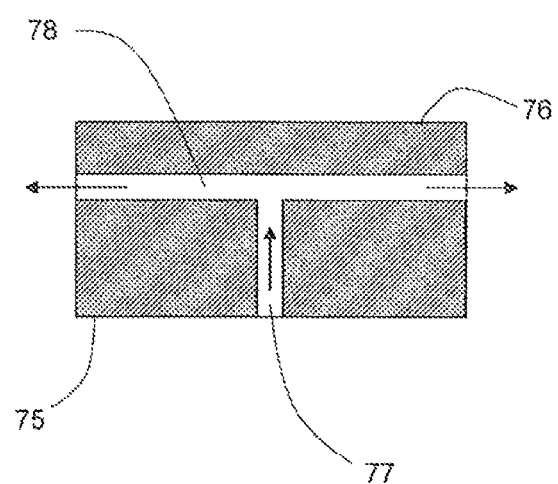
FIG. 18 is a sectional view illustrating a transfer stage of the flip chip bonder shown in FIG. 17.

As illustrated in FIG. 18, the transfer stage 75 includes an air inflow channel 77 extending from its lower surface (a side opposite of the surface 76 on which the chip 20 is held) toward the surface 76, and a horizontal cooling channel 78 communicating with the air inflow channel 77 and extending along the surface 76. As illustrated in FIG. 18, cooling air cools the transfer stage 75 by entering the air inflow channel 77, flowing through the horizontal cooling channel 78, and flowing out from a side of the transfer stage 75. In the described embodiment, the transfer stage 75 is cooled by but not limited to air, and liquid such as water can be used as a cooling medium. The air inflow channel 77 and the horizontal cooling channel 78 constitute a cooling mechanism.

In the flip chip bonder 103 according to this embodiment, the bonding tool 50 is also attached to the bonding head 40, and moved horizontally and vertically by the bonding head 40, as described with reference to FIG. 1. Further, the bonding tool 50 includes a suction surface 51 at a tip for suctioning the chip 20 (a lower surface in FIG. 1), and contains a pulse heater that is not depicted and configured to heat the chip 20 up to a temperature at which bumps provided on the chip 20 can melt (300° C. to 350° C.).

Figure 19:
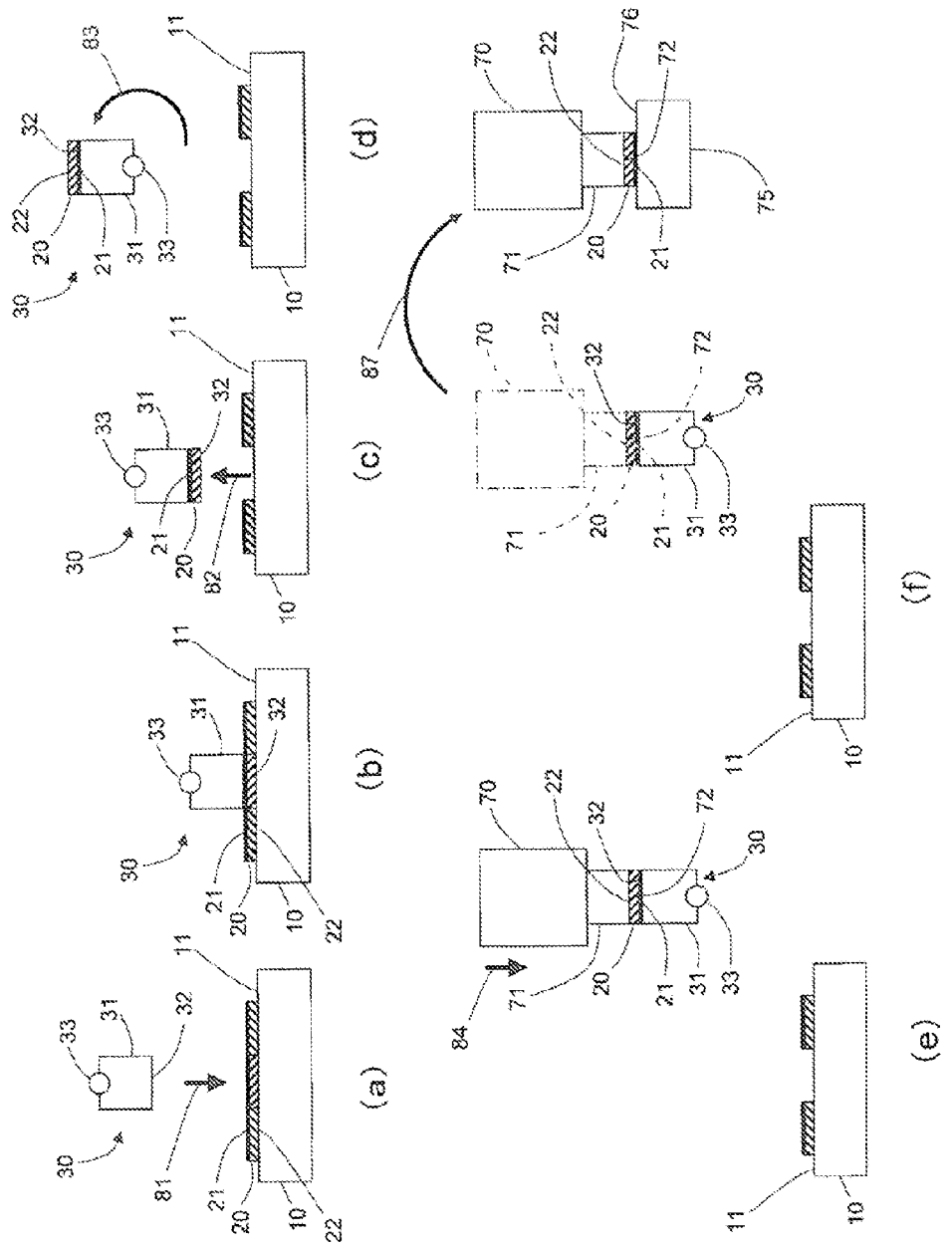
FIG. 19 is a flow diagram illustrating a bonding process by the flip chip bonder of the different embodiment according to the present invention.
Figure 20:
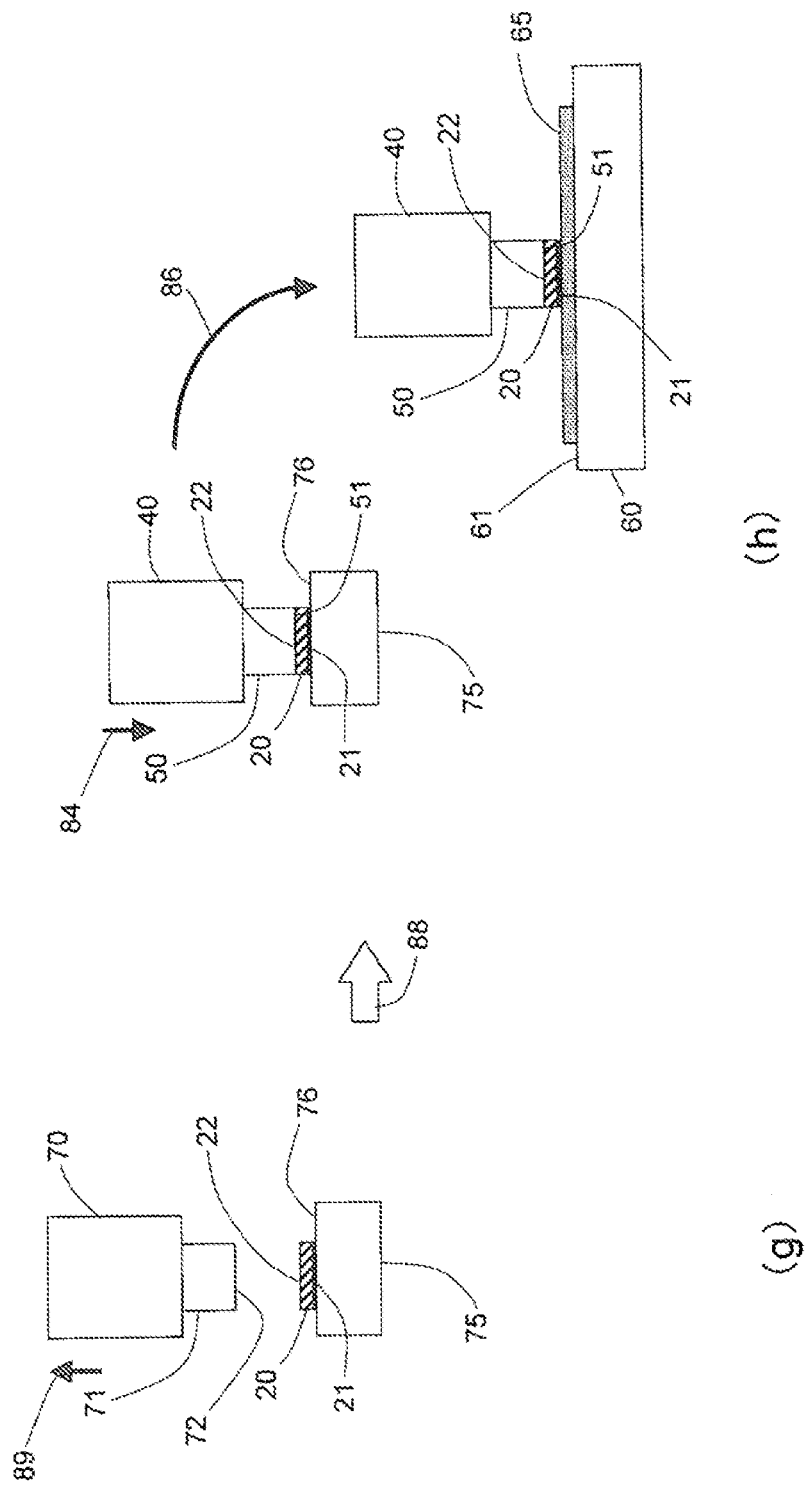
FIG. 20 is a flow diagram illustrating a bonding process by the flip chip bonder of the different embodiment according to the present invention.

In the following, with reference to FIG. 19 and FIG. 20, a process in which the chip 20 is bonded to the circuit board 65 by the flip chip bonder 103 according to this embodiment will be described. Like steps and components as in the embodiment described with reference to FIG. 1 through FIG. 7 are denoted by like reference numerals, and description thereof shall be omitted.

As illustrated in FIG. 19(a) through FIG. 19(d), the chip 20 is suctioned, picked up, and flipped with the pickup flipping collet 30. Then, as indicated by an arrow 84 in FIG. 19(e), a suction surface 72 of the collet 71 attached to the transfer head 70 is brought into contact with the surface 22 of the chip 20 to receive the chip 20 from the collet main body 31 of the pickup flipping collet 30. As indicated by an arrow 87 in FIG. 19(f), the transfer head 70 moves the collet 71 above the transfer stage 75, and the chip 20 suctioned to the collet 71 is passed to the surface 76 of the transfer stage 75. As illustrated in FIG. 20(g), upon finishing of the passing of the chip 20 to the transfer stage 75, the transfer head 70 moves the collet 71 upward. As indicated by an outlined arrow 88 in FIG. 20(g), the transfer stage moves to a position for transferring the chip 20 to the bonding tool 50 while the chip 20 in the flipped state is held on the surface 76. As illustrated in FIG. 20(h), when the transfer stage 75 arrives at the predetermined position for transferring, the bonding tool 50 receives the chip 20 from the surface 76 of the transfer stage 75, and bonds the chip 20 onto the circuit board 65 that is held by suctioning on a surface 61 of the bonding stage 60.

Similarly to the temperature of the collet main body 31 as shown at time t1 in FIG. 4(b), when the chip 20 is passed to the bonding tool 50, the temperature of the transfer stage 75 increases from the initial temperature TC1 about 30° C. to the temperature TC2 about 50° C. Then, the transfer stage 75 is cooled by cooling air flowing through the air inflow channel 77 and the horizontal cooling channel 78, and its temperature returns to the initial temperature TC1, similarly to the temperature of the collet main body 31 as shown at time t2 in FIG. 4(b).

In the flip chip bonder 103 according to this embodiment, the temperature TB2 of the bonding tool 50 for receiving the chip 20 is made higher than conventional technique by cooling the transfer stage 75 that transfers the chip 20 with the bonding tool 50, and therefore time for cooling the bonding tool 50 after bonding can be reduced. Thus, it is possible to largely reduce the cycle time for flip chip bonding.

Figure 21:
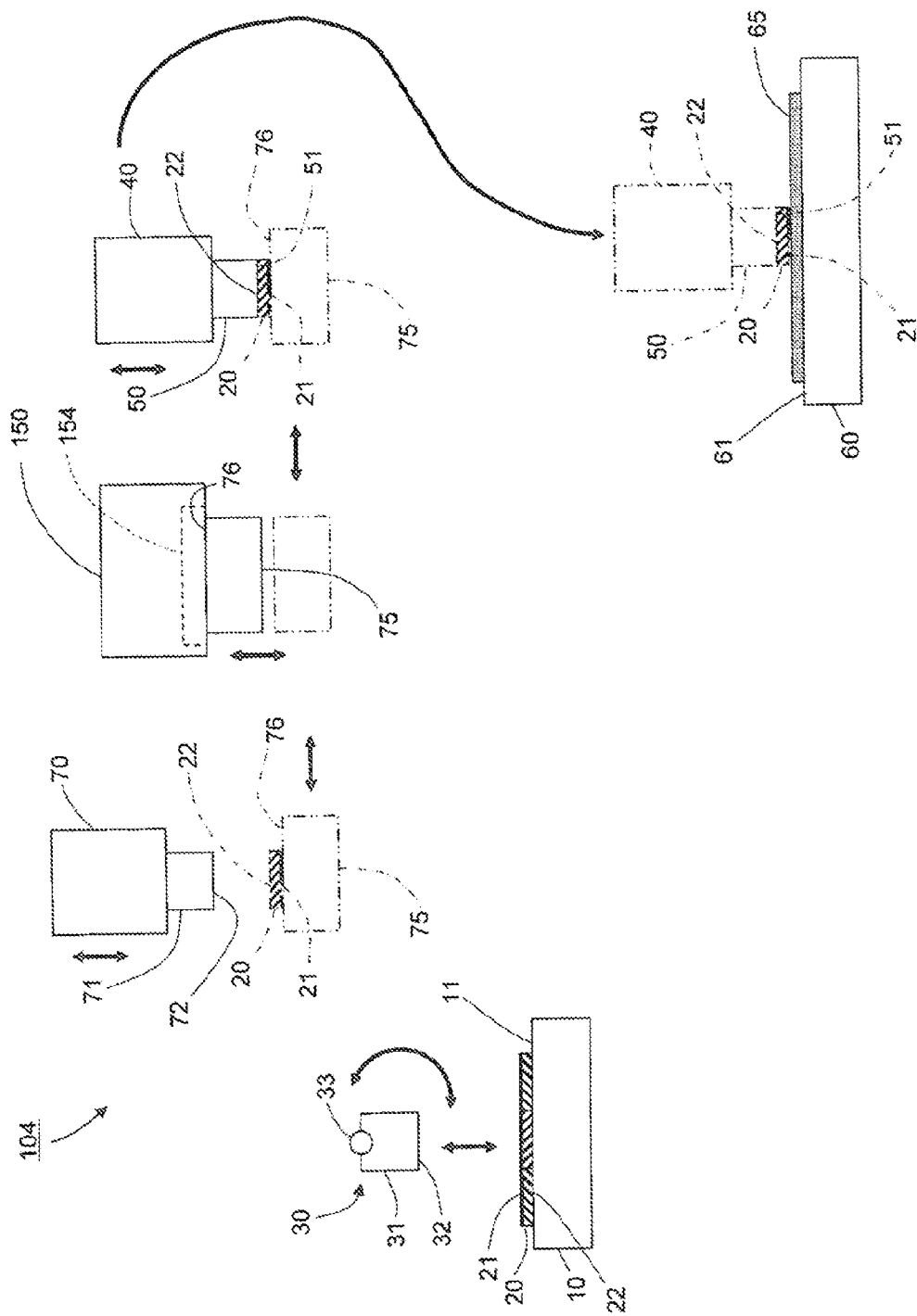
FIG. 21 is an elevational view illustrating a structure of a flip chip bonder of a different embodiment according to the present invention.

Similarly to the relation between the cooling temperature TC1 of the collet main body 31 and the temperature TB2 of the bonding tool 50 for receiving the chip 20 as described with reference to FIG. 6 and FIG. 7, a relation between the cooling temperature of the transfer stage 75 and the temperature TB2 of the bonding tool 50 for receiving the chip 20 is such that the lower the cooling temperature of the transfer stage 75 is, the higher the temperature TB2 of the bonding tool 50 for receiving the chip 20 can be made, and the shorter the cycle time for bonding can become. Further, when the size of the chip 20 to be passed is smaller, an amount of heat transferred from the bonding tool 50 to the transfer stage 75 when the chip 20 is transferred becomes smaller even if the cooling temperature of the transfer stage 75 is unchanged. Therefore, it is possible to further increase the temperature TB2 of the bonding tool 50 for receiving the chip 20, and to further reduce the cycle time for bonding. Moreover, when the heat capacity of the transfer stage 75 is large with respect to the heat capacity of the bonding tool 50, an increase of the temperature of the transfer stage 75 is smaller even if an amount of heat transferred from the bonding tool 50 to the transfer stage 75 is the same. Therefore, the temperature TB2 of the bonding tool 50 for receiving the chip 20 can be made higher as the heat capacity of the transfer stage 75 becomes higher with respect to the heat capacity of the bonding tool 50, and it is possible to further reduce the cycle time for bonding Next, a flip chip bonder 104 according to a different embodiment of the present invention will be described with reference to FIG. 21. Like components as in the embodiment previously described with reference to FIG. 17 through FIG. 20 are denoted by like reference numerals, and description thereof shall be omitted. The flip chip bonder 104 according to this embodiment is configured such that the flip chip bonder 103 previously described with reference to FIG. 17 through FIG. 20 is provided with a cooling stage 150 for cooling the transfer stage 75 to cool the transfer stage 75 by moving the transfer stage 75 in the vertical direction and bringing the surface 76 into close contact with a ground plate 154 of the cooling stage 150. The cooling stage 150 is configured such that the cooling stage 110 according to the embodiment described with reference to FIG. 8 through FIG. 14 is inverted upside down. An effect of this embodiment is the same as that of the embodiment described with reference to FIG. 17 through FIG. 20. In this embodiment, the transfer stage 75 is moved in the vertical direction to be brought into close contact with the ground plate 154 of the cooling stage 150. However, in an opposite manner, the cooling stage 150 can be moved in the vertical direction to bring the ground plate 154 into close contact with the surface 76 of the transfer stage 75.

The present invention is not limited to the embodiment described above, and includes any alterations and modifications without departing from the technical scope and the spirit of the present invention as defined in the appended claims.

The invention claimed is:

1. A flip chip bonder comprising:
a flip mechanism configured to flip a chip;
bonding tool configured to receive the chip flipped by the flip mechanism from the flip mechanism and to bond the received chip to a substrate; and
a cooling mechanism configured to cool the flip mechanism;
wherein the flip mechanism includes a holding member for holding the flipped chip, and
the cooling mechanism cools the holding member down to a predetermined temperature before the bonding tool receives the chip.

2. The flip chip bonder according to claim 1, wherein a heat capacity of the holding member is larger than a heat capacity of the bonding tool.

3. The flip chip bonder according to claim 1, wherein the holding member is a pickup flipping collet configured to pass the chip to the bonding tool in a state in which the chip is suctioned and flipped.

4. The flip chip bonder according to claim 2, wherein the holding member is a pickup flipping collet configured to pass the chip to the bonding tool in a state in which the chip is suctioned and flipped.

5. The flip chip bonder according to claim 1, wherein the holding member is a transfer stage configured to transfer the chip in a state in which the chip is flipped, and to pass the chip to the bonding tool in the flipped state.

6. The flip chip bonder according to claim 2, wherein the holding member is a transfer stage configured to transfer the chip in a state in which the chip is flipped, and to pass the chip to the bonding tool in the flipped state.

7. The flip chip bonder according to claim 1, wherein the cooling mechanism cools one of an inner surface and an outer surface of the holding member.

8. The flip chip bonder according to claim 1, wherein the cooling mechanism is provided with:
a base body; and
a cooling member including: a ground plate having a ground surface with which a surface of the holding member is brought into contact; and a radiating member attached to the ground plate, and
the cooling member is supported on the base body by support mechanism that makes an orientation of the ground surface variable, so that the orientation of the ground surface aligns with an orientation of the surface of the holding member.

9. The flip chip bonder according to claim 8, wherein a heat capacity of the cooling member is larger than a heat capacity of the holding member.

10. The flip chip bonder according to claim 8, wherein the radiating member is attached to a surface of the ground plate on a side opposite of the ground surface.

11. The flip chip bonder according to claim 8, wherein the radiating member is configured as radiator fins, a cooling fan configured to cool the radiator fins is provided.

12. The flip chip bonder according to claim 8, wherein the support mechanism supports the ground plate on the base body rotatably about two axes including: a first axis along the ground surface; and a second axis along the ground surface and perpendicular to the first axis.

13. The flip chip bonder according to claim 8, further comprising:
a cooling nozzle provided for the base body, and configured to blow cooling air to the holding member having the surface in contact with the ground surface.

14. The flip chip bonder according to claim 8, wherein heat transfer from the holding member to the ground plate occurs when the ground surface of the ground plate is brought into contact with the surface of the holding member.

15. A flip chip bonding method comprising:
a step of preparing a flip chip bonder including: a flip mechanism configured to flip a chip; a bonding tool configured to receive the chip flipped by the flip mechanism from the flip mechanism and to bond the received chip to a substrate; and a cooling mechanism configured to cool the flip mechanism; and
a cooling step of cooling the holding member down to a predetermined temperature by the cooling mechanism before the bonding tool receives the chip.

* * * * *